United States Patent
Pagani et al.

(10) Patent No.: US 9,076,883 B2
(45) Date of Patent: Jul. 7, 2015

(54) INTEGRATED ELECTRONIC DEVICE WITH TRANSCEIVING ANTENNA AND MAGNETIC INTERCONNECTION

(71) Applicant: STMICROELECTRONICS S.r.l., Agrate Brianza (IT)

(72) Inventors: Alberto Pagani, Nova Milanese (IT); Giovanni Girlando, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/079,976

(22) Filed: Nov. 14, 2013

(65) Prior Publication Data

US 2014/0070345 A1   Mar. 13, 2014

Related U.S. Application Data

(63) Continuation of application No. 12/645,201, filed on Dec. 22, 2009, now Pat. No. 8,604,570.

(30) Foreign Application Priority Data

Dec. 30, 2008 (IT) .............................. TO2008A1014

(51) Int. Cl.
*H01L 29/82* (2006.01)
*H01L 23/48* (2006.01)
(Continued)

(52) U.S. Cl.
CPC .................. *H01L 29/82* (2013.01); *H01L 23/48* (2013.01); *H01L 23/481* (2013.01); *H01L 23/645* (2013.01); *H01L 23/66* (2013.01); *H01L 24/16* (2013.01); *H01L 24/29* (2013.01); *H01L 24/48* (2013.01); *H01L 25/0657* (2013.01);
(Continued)

(58) Field of Classification Search
CPC .......... H01L 29/82; H01L 27/22; H01L 43/02
USPC ........... 257/421, 422, 531, E29.323; 336/200
See application file for complete search history.

(56) References Cited

U.S. PATENT DOCUMENTS

| 5,095,357 A | 3/1992 | Andoh et al. |
| 5,476,804 A * | 12/1995 | Lazzari .............................. 438/3 |

(Continued)

FOREIGN PATENT DOCUMENTS

| EP | 0782001 | 7/1997 |
| EP | 0812016 | 12/1997 |

(Continued)

OTHER PUBLICATIONS

Ripka et al., "Symmetrical Core Improves Micro-Fluxgate Sensors", Sensors and Actuators A, Elsevier Sequoia S.A., Lausanne, CH, vol. 92, No. 1-3, 20001-08-01.

(Continued)

*Primary Examiner* — Peniel M Gumedzoe
(74) *Attorney, Agent, or Firm* — Gardere Wynne Sewell LLP

(57) ABSTRACT

An embodiment of an integrated electronic device having a body, made at least partially of semiconductor material and having a top surface, a bottom surface, and a side surface, and a first antenna, which is integrated in the body and enables magnetic or electromagnetic coupling of the integrated electronic device with a further antenna. The integrated electronic device moreover has a coupling region made of magnetic material, which provides, in use, a communication channel between the first antenna and the further antenna.

28 Claims, 24 Drawing Sheets

(51) Int. Cl.
- *H01L 23/64* (2006.01)
- *H01L 23/66* (2006.01)
- *H01L 25/065* (2006.01)
- *H01L 25/10* (2006.01)
- *H01Q 1/22* (2006.01)
- *H01Q 1/36* (2006.01)
- *H01Q 7/00* (2006.01)
- *H01L 23/00* (2006.01)
- *H01L 25/16* (2006.01)

(52) U.S. Cl.
CPC ............... *H01L25/105* (2013.01); *H01L 25/16* (2013.01); *H01L 2223/6677* (2013.01); *H01L 2224/0557* (2013.01); *H01L 2224/13025* (2013.01); *H01L 2224/16* (2013.01); *H01L 2224/32145* (2013.01); *H01L 2224/48091* (2013.01); *H01L 2224/48227* (2013.01); *H01L 2224/48465* (2013.01); *H01L 2225/06513* (2013.01); *H01L 2225/06517* (2013.01); *H01L 2225/06541* (2013.01); *H01L 2225/06551* (2013.01); *H01L 2225/06562* (2013.01); *H01L 2924/01057* (2013.01); *H01L 2924/01059* (2013.01); *H01L 2924/14* (2013.01); *H01L 2924/15311* (2013.01); *H01L 2924/19042* (2013.01); *H01L 2924/30105* (2013.01); *H01L 2924/30107* (2013.01); *H01L 2924/3011* (2013.01); *H01L 2924/3025* (2013.01); H01Q 1/2283 (2013.01); H01Q 1/36 (2013.01); H01Q 7/00 (2013.01); *H01L 2924/01033* (2013.01); *H01L 2225/06531* (2013.01); *H01L 2225/0651* (2013.01); *H01L 2225/06568* (2013.01); *H01L 2224/2929* (2013.01); *H01L 2224/293* (2013.01); *H01L 2224/29399* (2013.01); *H01L 2924/00013* (2013.01); *H01L 2924/00014* (2013.01); *H01L 2924/0002* (2013.01)

(56) References Cited

U.S. PATENT DOCUMENTS

| | | | |
|---|---|---|---|
| 5,519,582 A * | 5/1996 | Matsuzaki | 361/783 |
| 5,852,866 A | 12/1998 | Kuettner et al. | |
| 7,262,680 B2 | 8/2007 | Wang | |
| 2005/0093669 A1 | 5/2005 | Ahn et al. | |
| 2005/0190035 A1 | 9/2005 | Wang | |
| 2005/0275497 A1 * | 12/2005 | Ramadan et al. | 336/200 |
| 2006/0148106 A1 | 7/2006 | Ding et al. | |
| 2007/0120681 A1 | 5/2007 | Yamazaki | |
| 2007/0262402 A1 | 11/2007 | Park | |
| 2008/0003760 A1 | 1/2008 | Gardner | |
| 2009/0033467 A1 | 2/2009 | Finocchiaro et al. | |
| 2009/0278246 A1 | 11/2009 | Hoshino et al. | |
| 2010/0164671 A1 | 7/2010 | Pagani et al. | |

FOREIGN PATENT DOCUMENTS

| | | |
|---|---|---|
| EP | 1564839 | 8/2005 |
| EP | 1988575 | 11/2008 |
| WO | 2005074402 | 8/2005 |
| WO | 2007029384 | 3/2007 |
| WO | 2010076187 A2 | 7/2010 |
| WO | 2010076187 A3 | 7/2010 |

OTHER PUBLICATIONS

Choi et al.; "An Integrated Micro Fluxgate Magnetic Sensor", Sensors and Actuators A, Elsevier Sequoia S.A., Lausanne, CH, vol. 55, No. 2, Jul. 31, 1996.

Italian Search Report for TO2008A001014, filed Dec. 30, 2008.

Donald Gardner, Ankur M. Crawford, and Shan Wang, "High Frequency (GHz) and Low Resistance Integrated Inductors Using Magnetic Materials", 2001, IEEE, pp. 101-103.

International Search Report Dated Jul. 2, 2010, for International Patent Application No. PCT/EP2009/067156 Filed Dec. 15, 2009, 5 Pages.

* cited by examiner

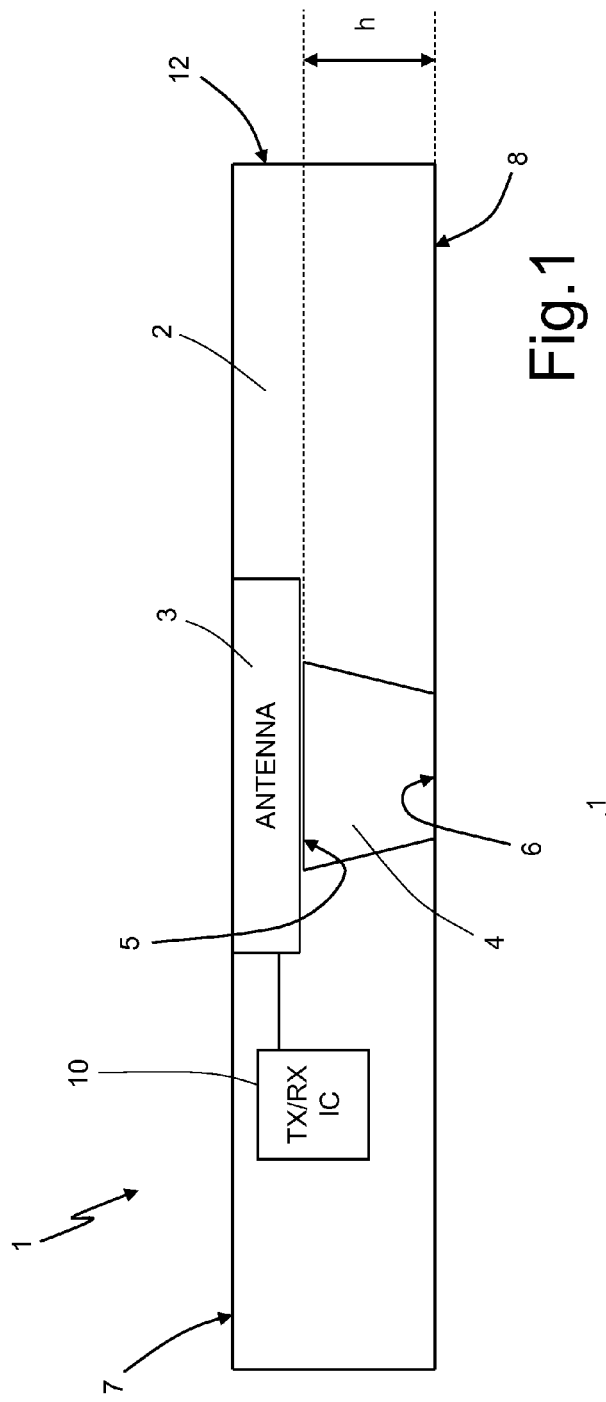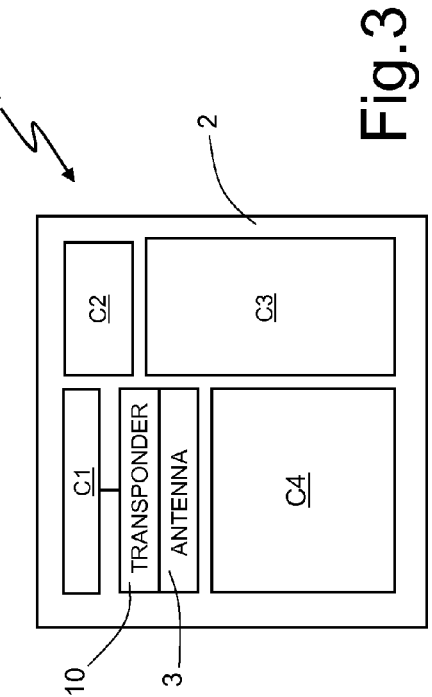

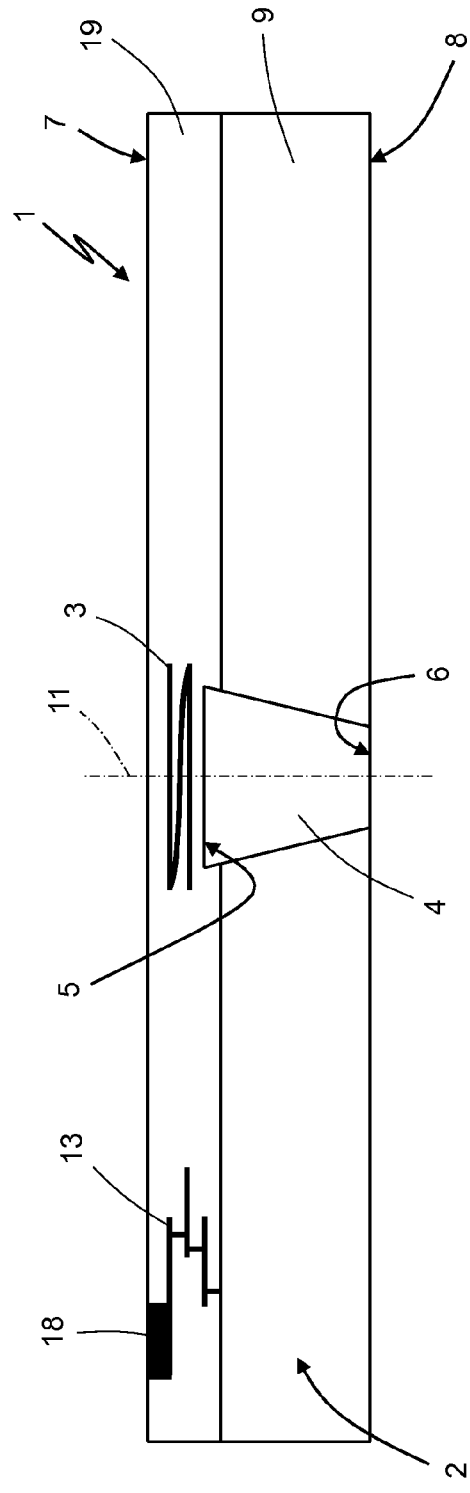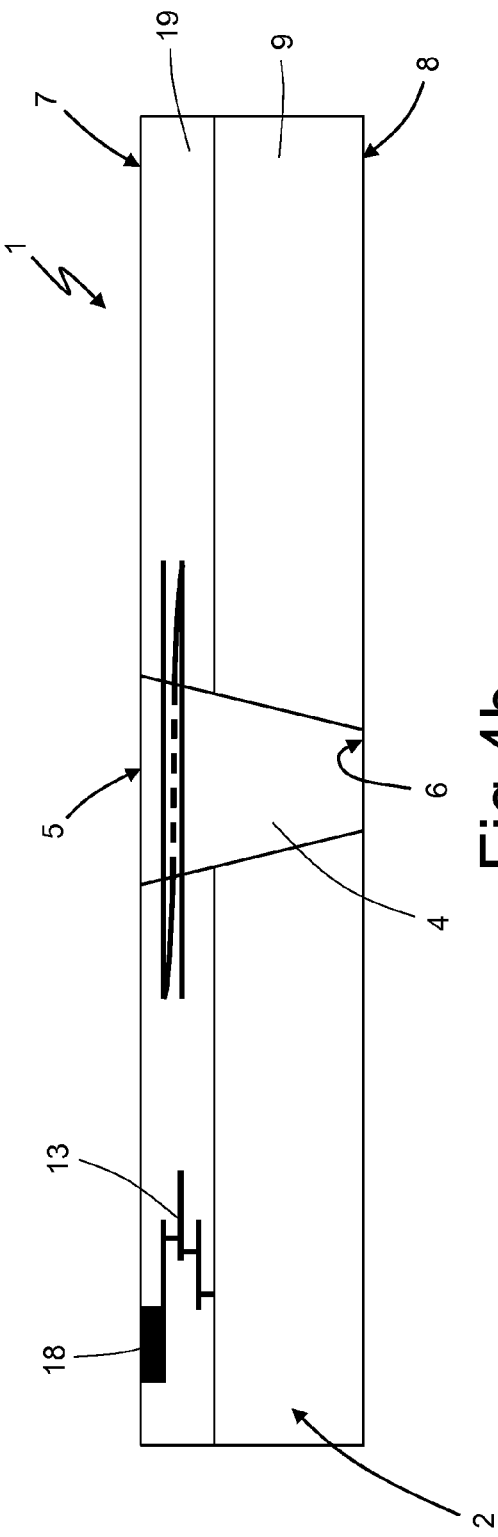

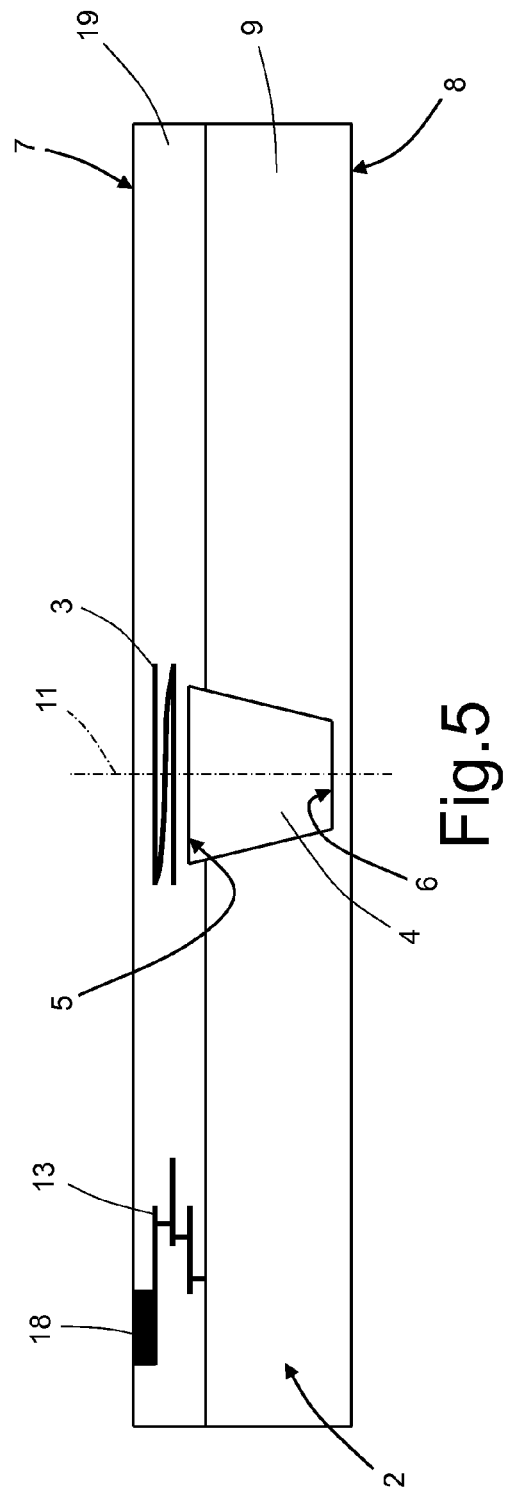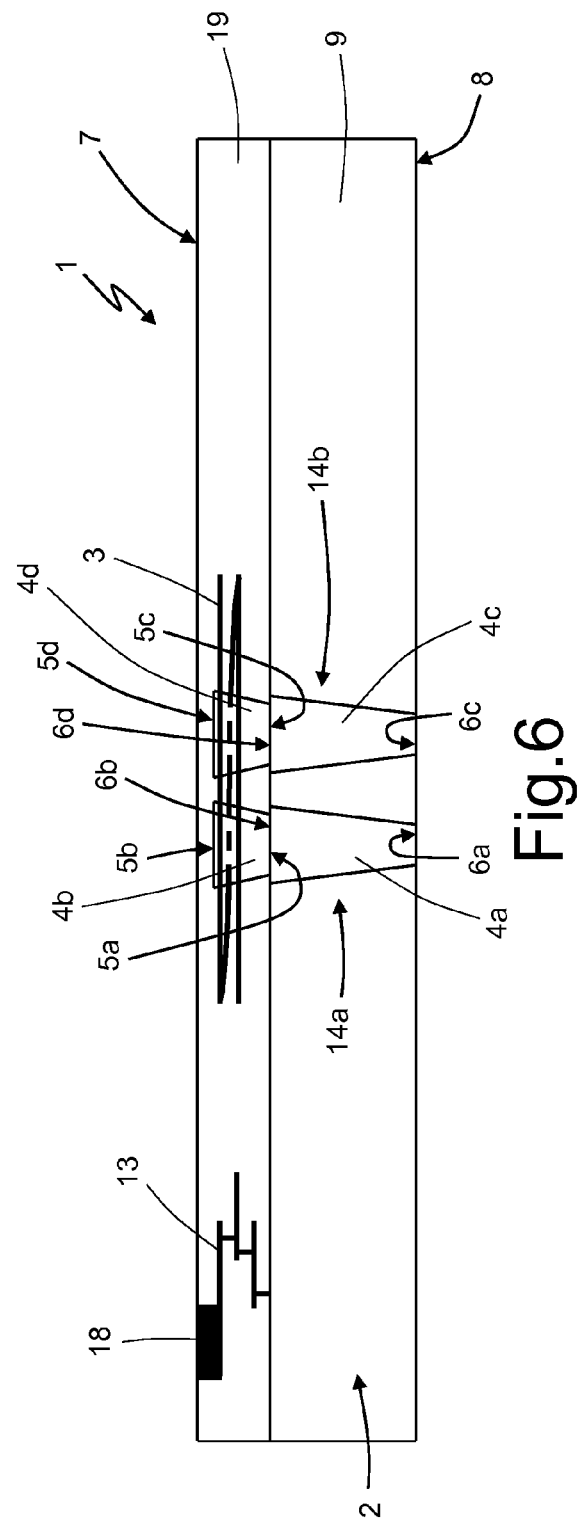

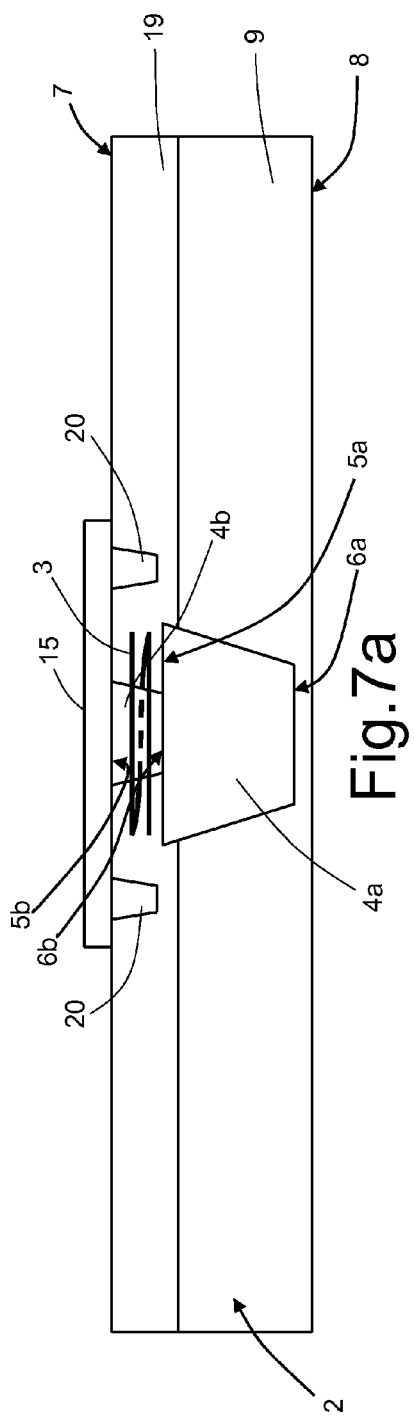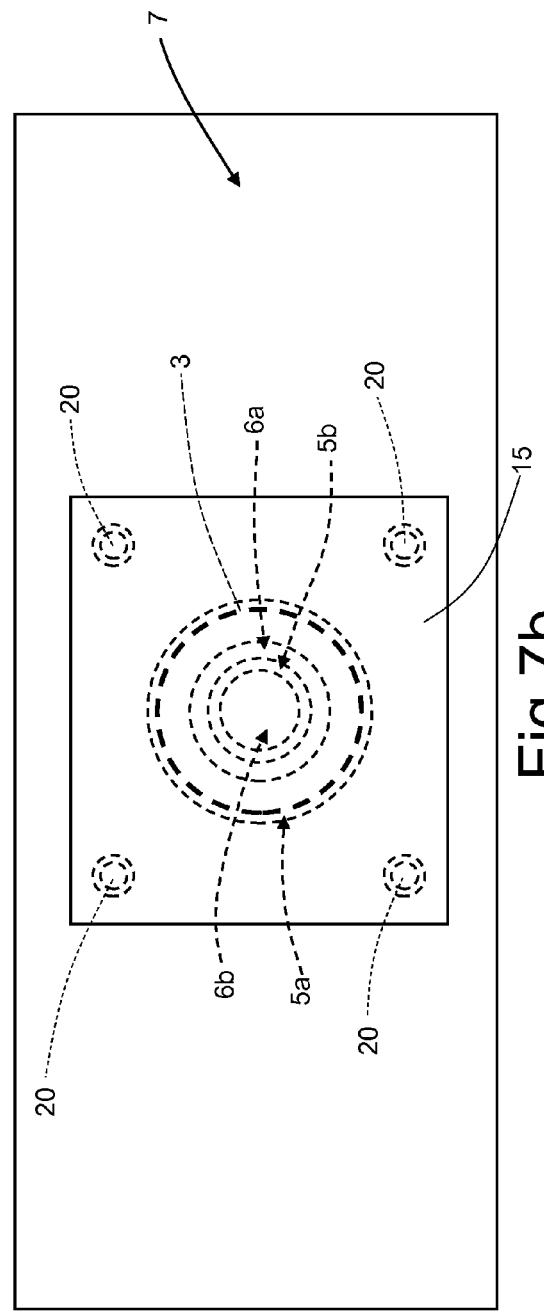

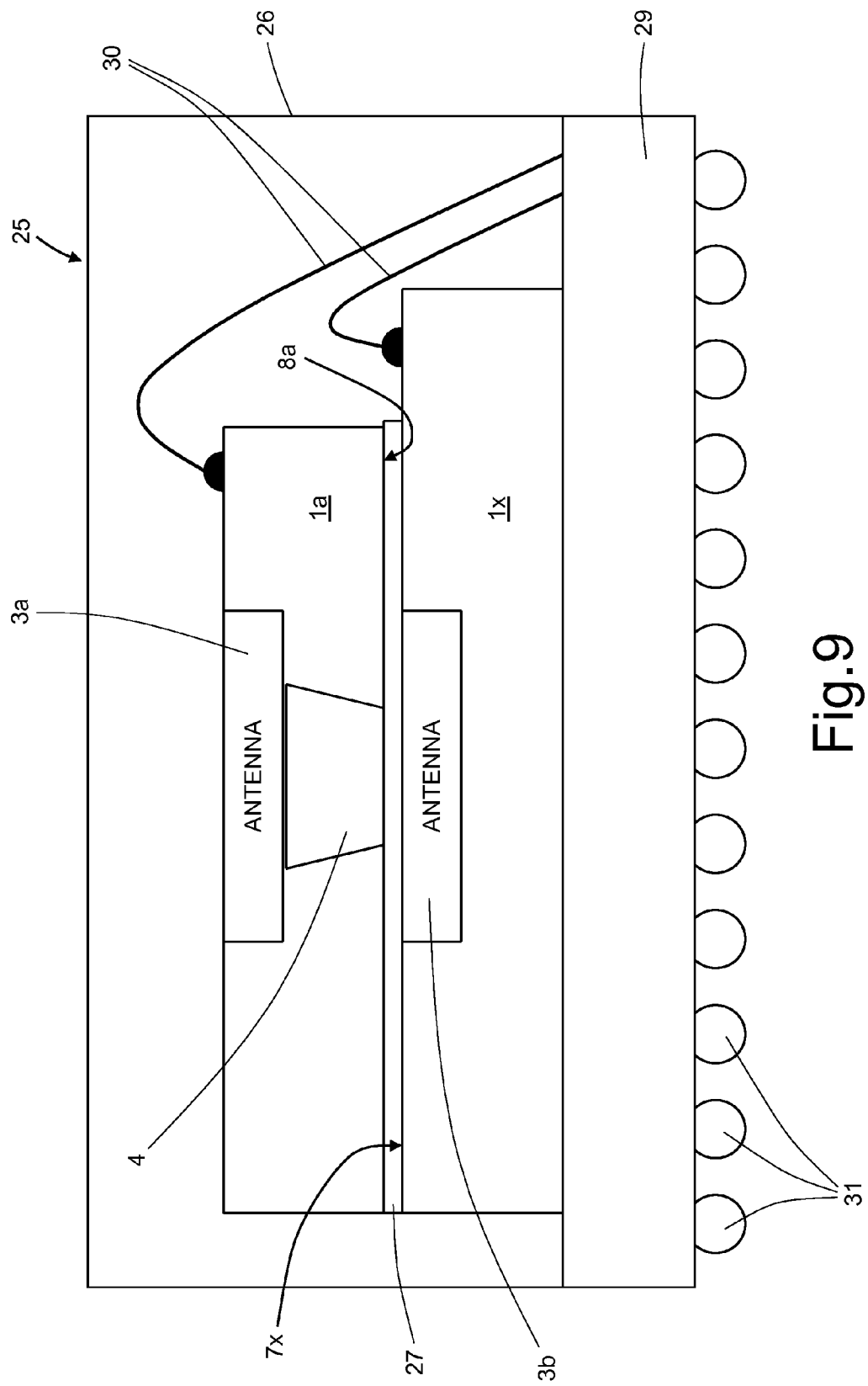

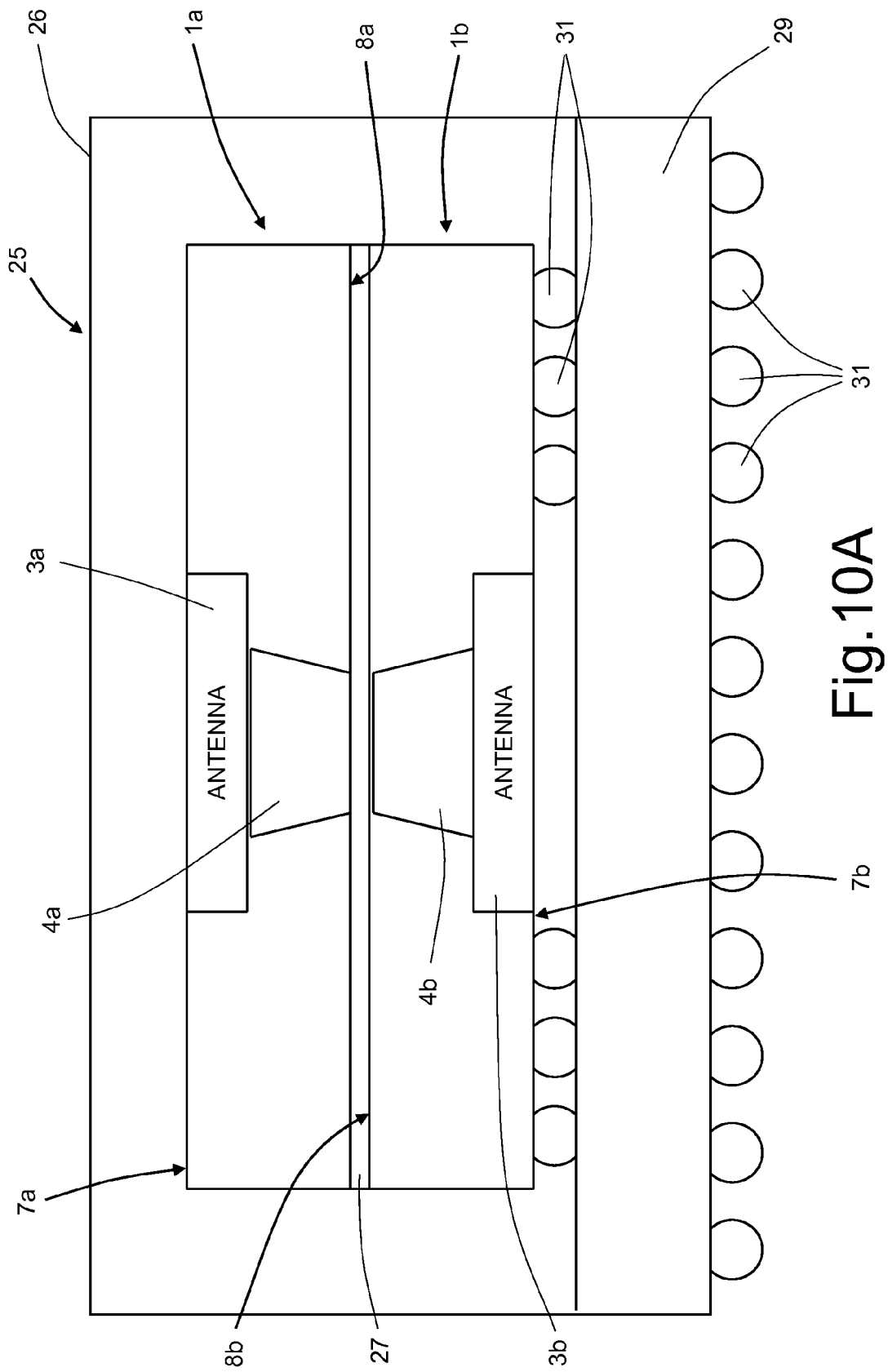

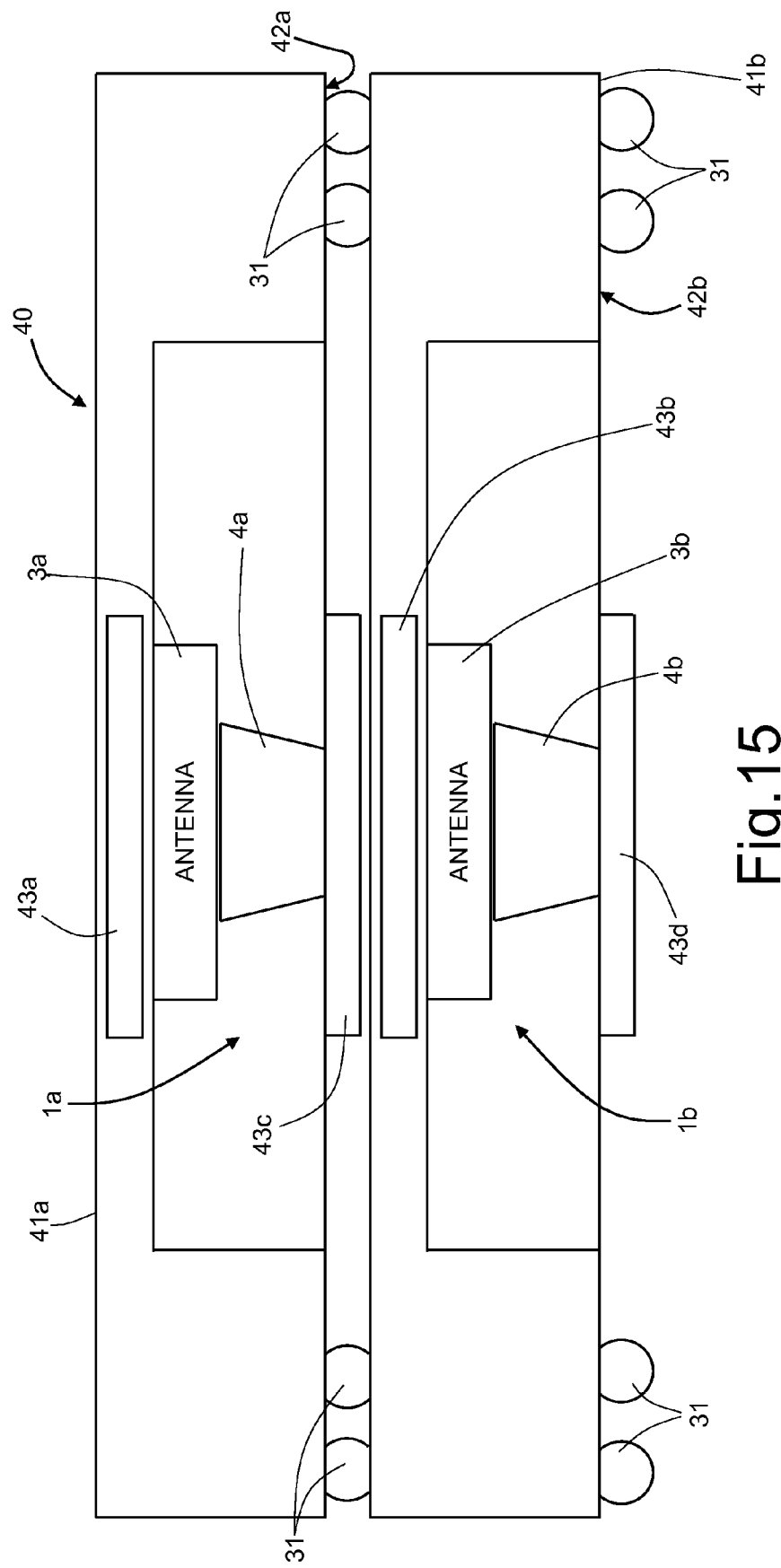

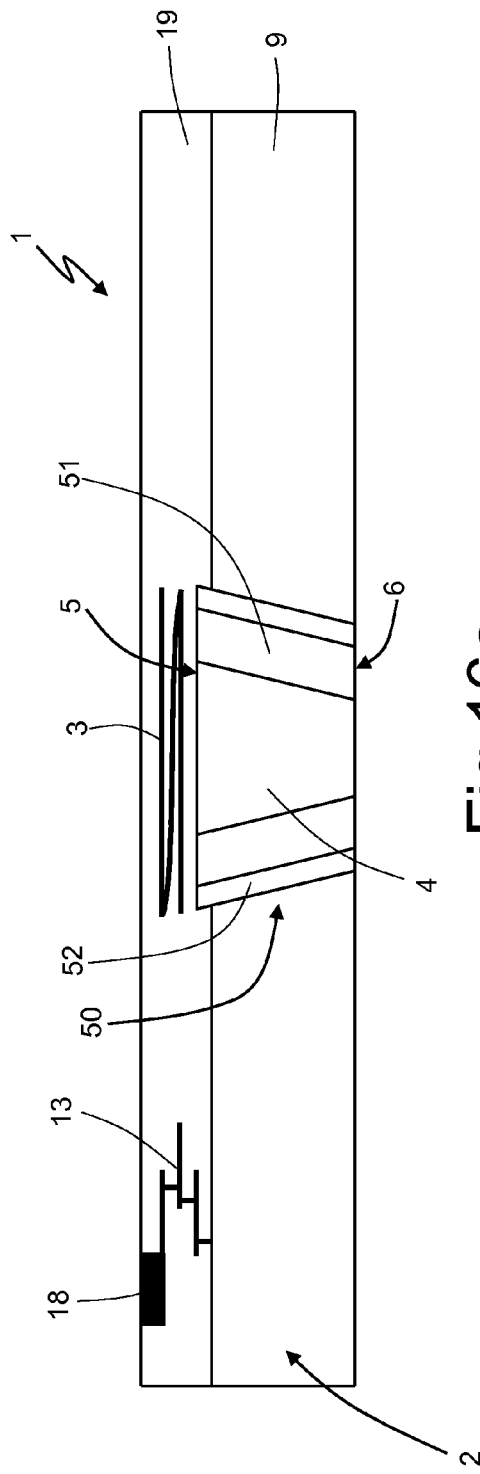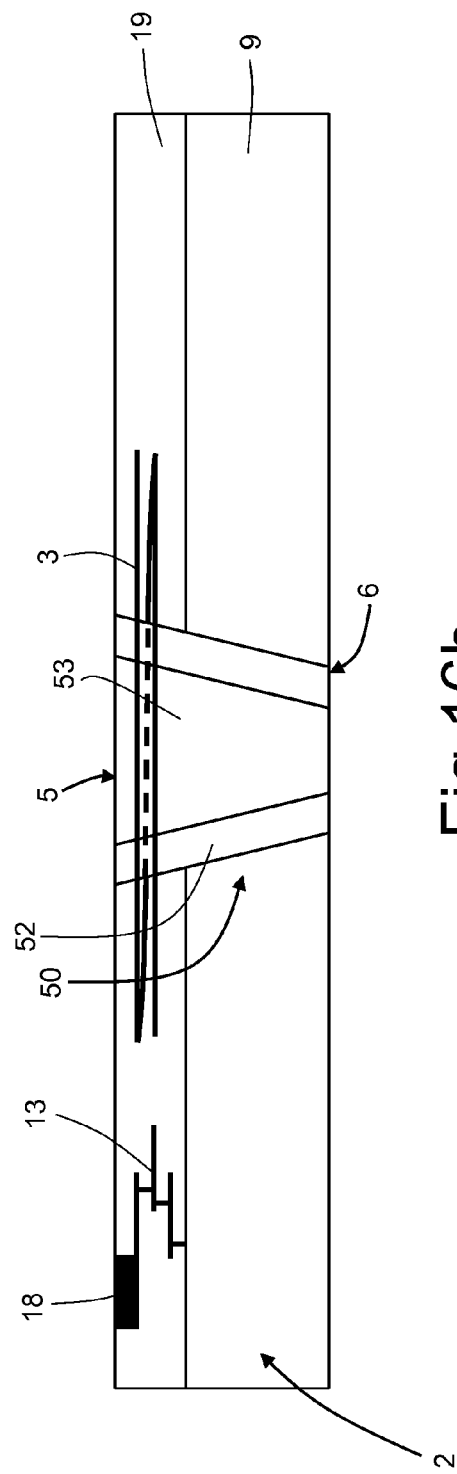

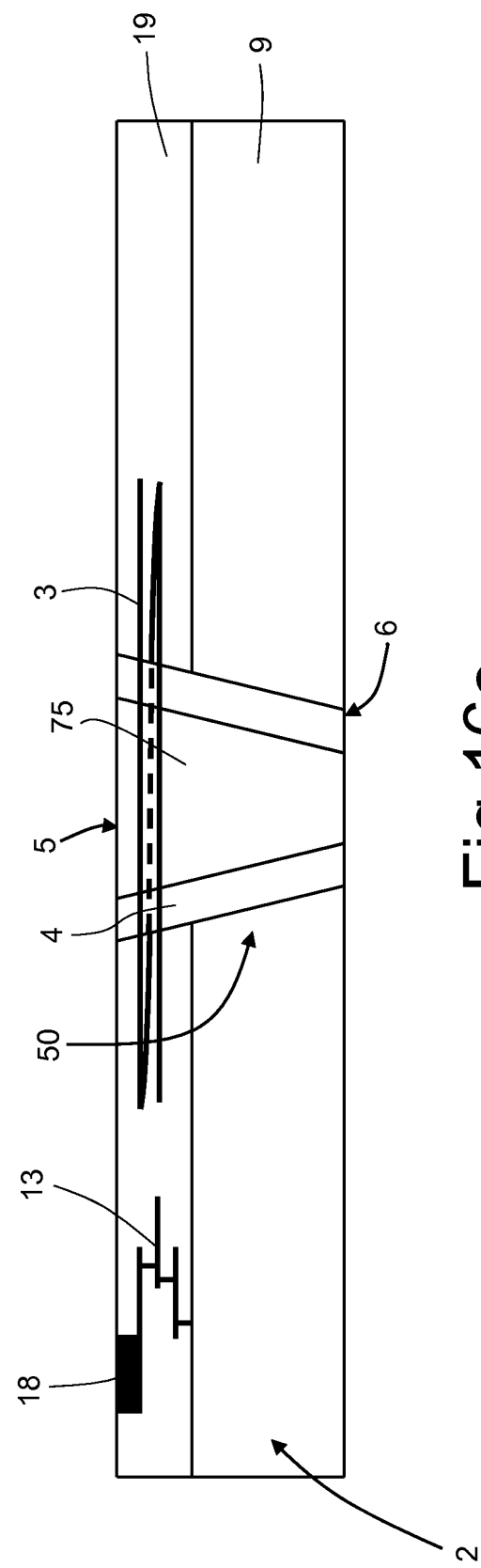

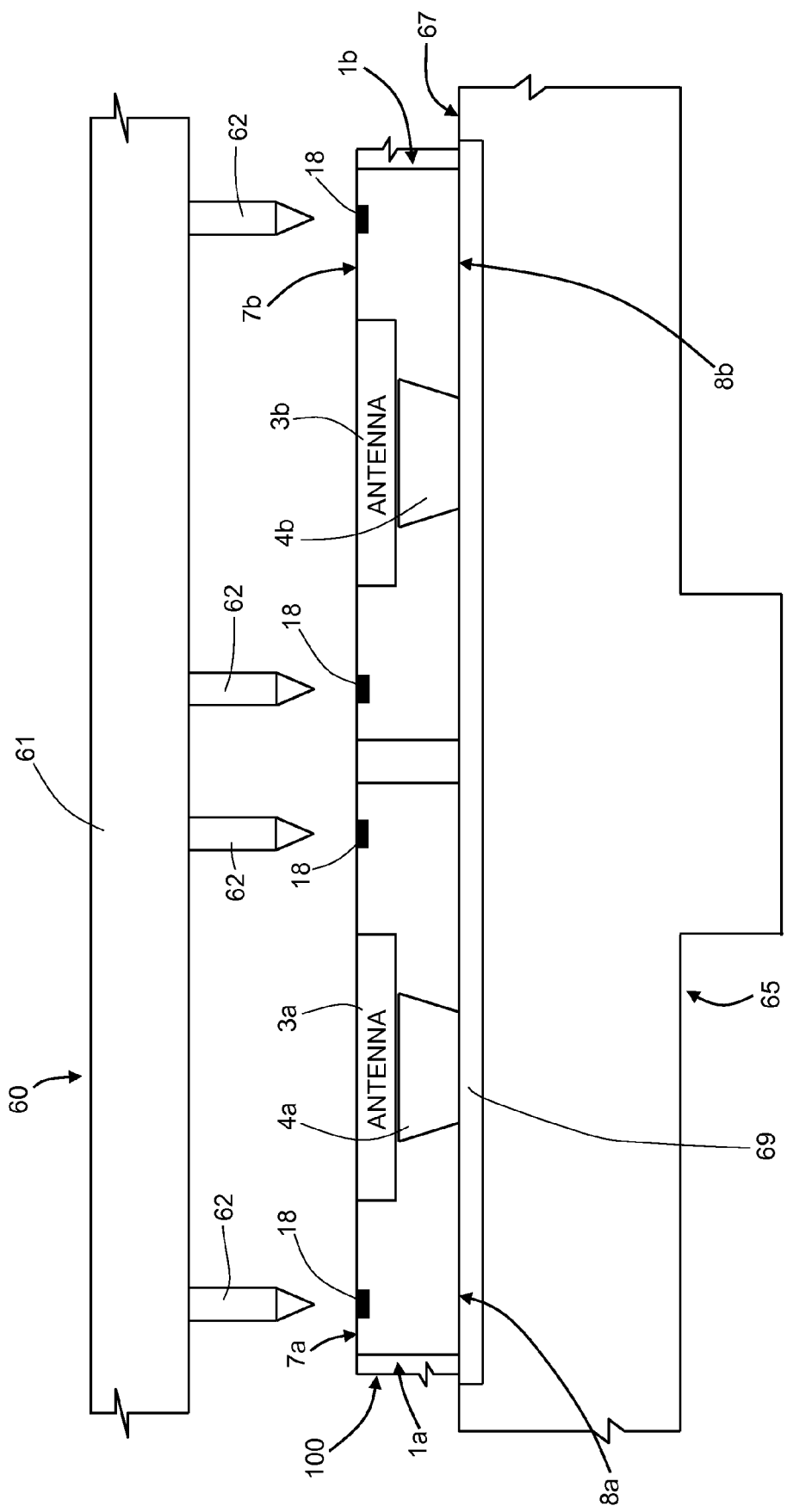

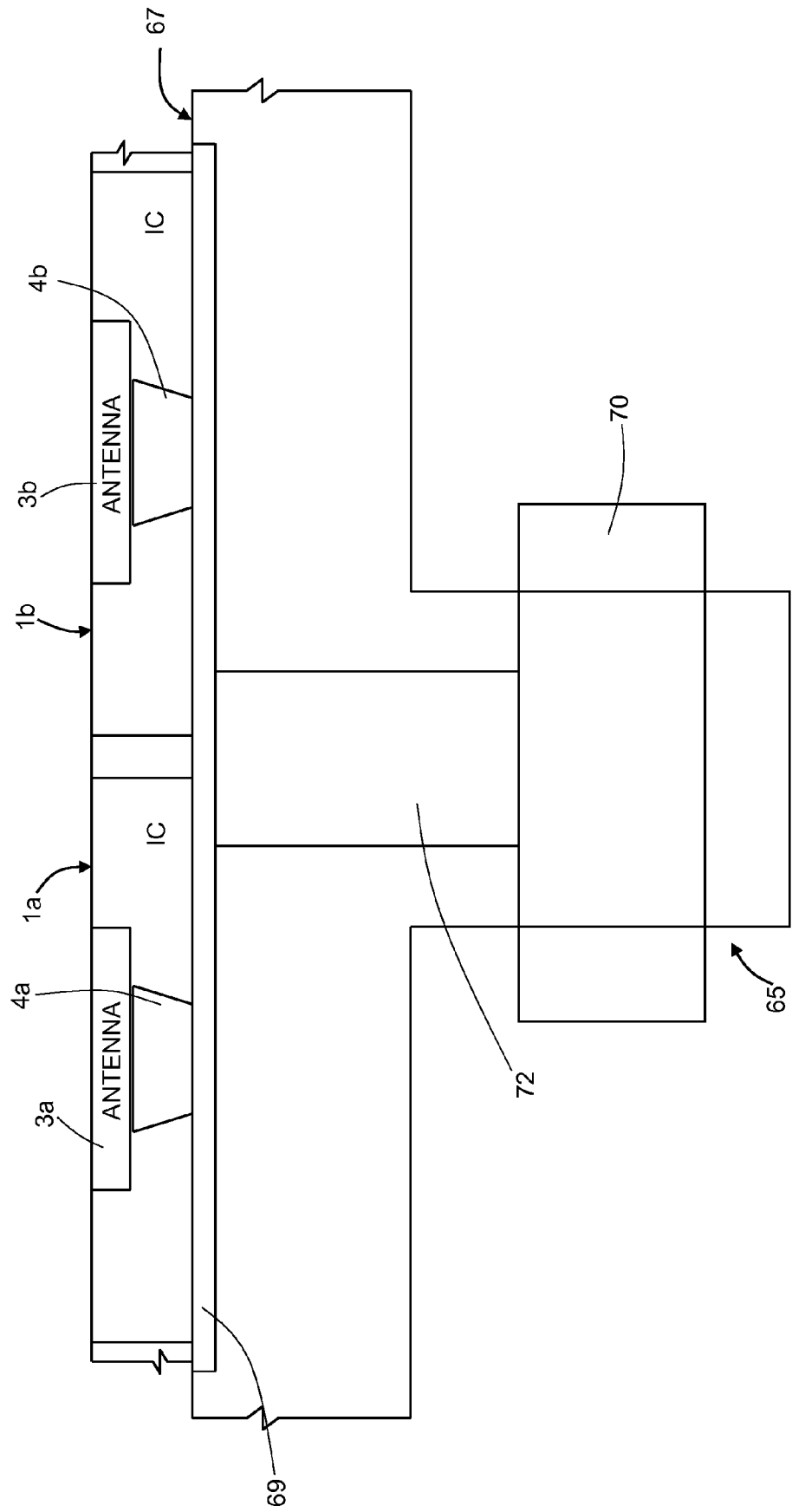

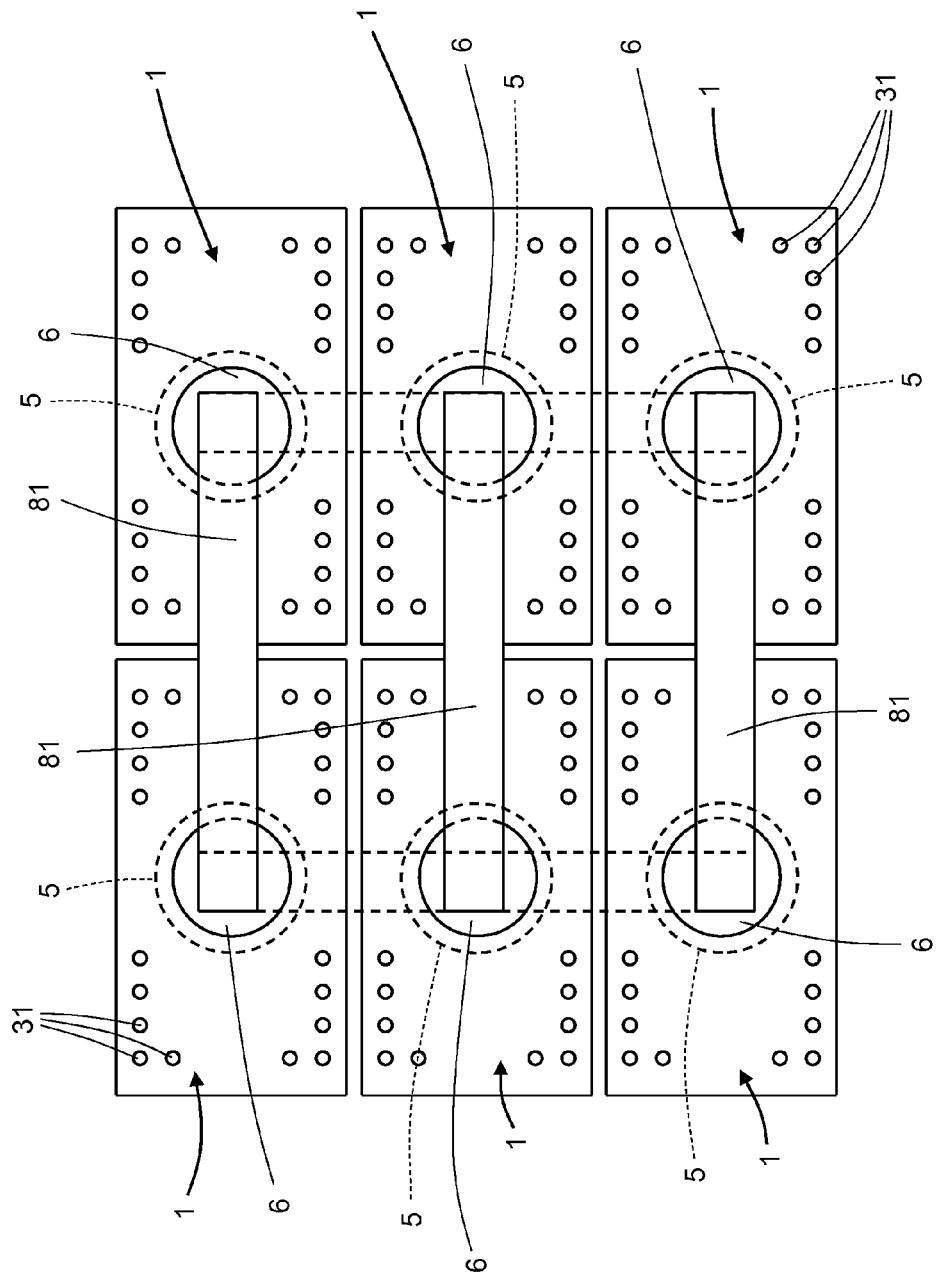

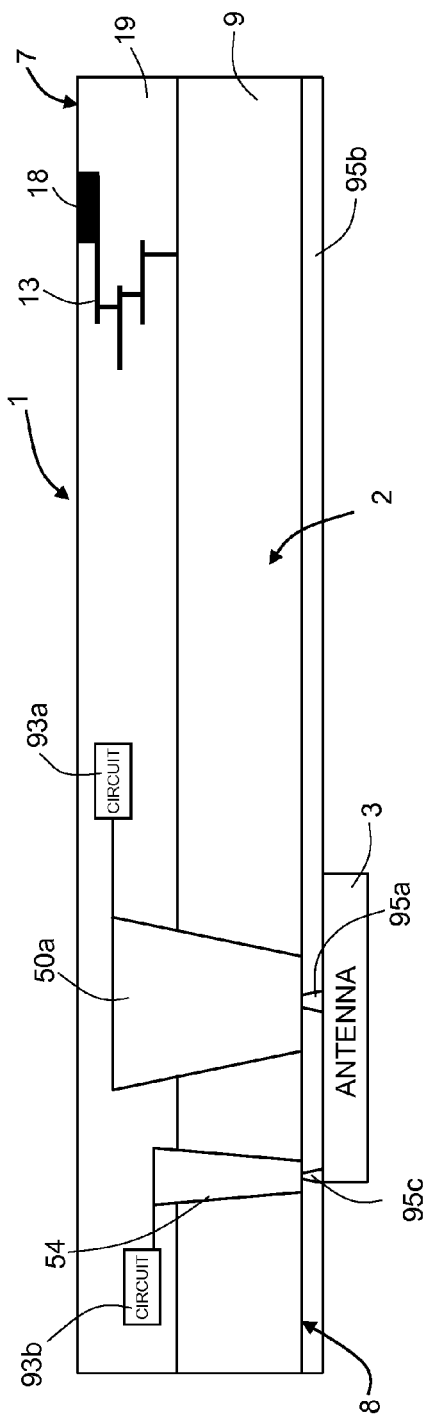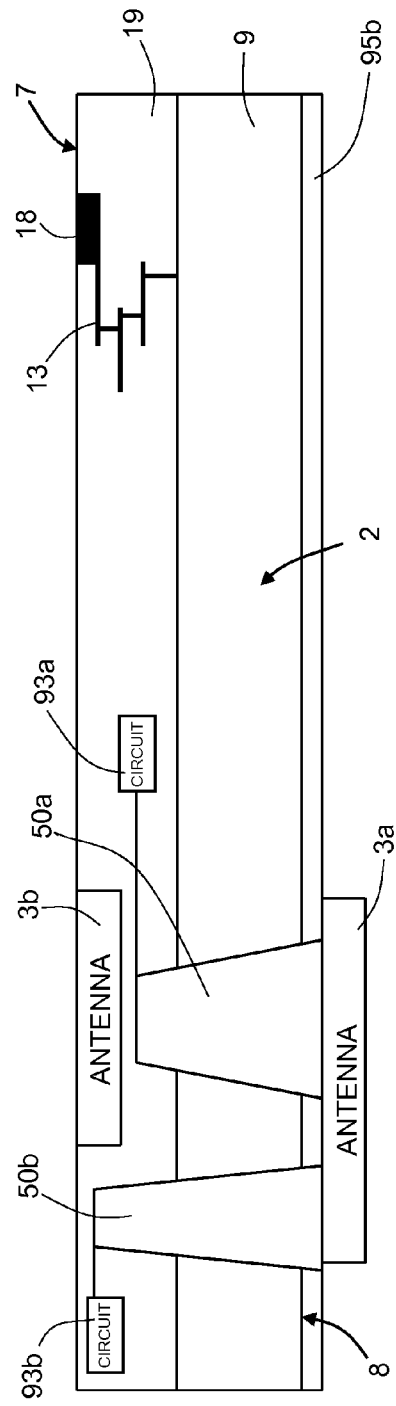

INTEGRATED ELECTRONIC DEVICE WITH TRANSCEIVING ANTENNA AND MAGNETIC INTERCONNECTION

PRIORITY CLAIM

The present application is a Continuation of copending U.S. patent application Ser. No. 12/645,201, filed Dec. 22, 2009; which application claims the benefit of Italian Patent Application Serial No. TO2008A001014, filed Dec. 30, 2008; all of the foregoing applications are incorporated herein by reference in their entireties.

TECHNICAL FIELD

An embodiment of the present disclosure relates to an integrated electronic device with transceiving antenna and magnetic interconnection.

BACKGROUND

As is known, generally a circuit integrated in a substrate communicates and interacts with the outside world by means of pads, i.e., portions of conductive material onto which other electronic devices may be coupled, such as, for example, other integrated circuits grown on the substrate, or else external electronic devices.

In detail, each pad represents alternatively a termination of a corresponding line for carrying signals internal to the integrated circuit, or else a power supply point of the integrated circuit itself, to which it is possible to connect supply circuits.

In the presence of a number of integrated circuits, pads of different integrated circuits may be coupled to one another, for example by wire bonding, or else by projecting contact regions (bumps), so as to create corresponding connections between the integrated circuits. In either case, there are set up one or more low-impedance resistive paths, whereby the integrated circuits are set in electrical contact.

In the case of a system in package (SiP), i.e., of an electronic device comprising, inside one and the same package, at least two integrated circuits and, possibly, passive components, the integrated circuits of the SiP are electrically coupled through their own pads. In addition, pads of different integrated circuits may be electrically coupled by means of so-called "through silicon vias" (TSVs).

Given a first integrated circuit grown on a substrate of semiconductor material and having a bottom surface and a top surface, a TSV is formed by a hole having a substantially cylindrical shape or shaped like a truncated cone, which passes through the substrate and extends from the top surface to the bottom surface. The hole is filled with electrically conductive material, i.e., material with a high electrical conductivity $\sigma$, and is insulated from the semiconductor material for example by means of an oxide coating in such a way that the TSV will provide a low-impedance resistive path designed to be traversed by an electric current.

Generally, the TSV contacts, in a top portion of the first integrated circuit, metal regions that overlie the substrate and that provide the pads of the integrated circuit. In this way, the pads may be set in electrical or ohmic contact, for example, with one or more pads of a second integrated circuit, set underneath the first integrated circuit. In this way, it is possible to obtain a stacked structure of integrated circuits, which are electrically coupled to one another.

The TSVs are also used for connecting integrated circuits within the so-called "systems on chip" (SoCs), i.e., monolithic electronic systems, each comprising two or more integrated circuits, which provide corresponding microelectronic components (memories, processors, graphic accelerators, etc.).

Irrespective of the type of electronic device in which they are inserted, TSVs may present certain drawbacks.

In particular, TSVs may be subject to considerable parasitic phenomena (leakage currents, parasitic inductances and capacitances, etc.), which render their electrical behavior non-ideal. In addition, each TSV provides a connection between the first and second integrated circuits, but in general the connection is not shared by other integrated circuits, with the consequence that, in the case of complex electronic systems (for example, SoCs with numerous microelectronic components), there is the need for multiplication of the TSVs necessary for providing the required connections, with consequent increase in the space occupied by the TSVs and the need to reduce the dimensions (diameter) of the TSVs themselves. Typically, the diameter of the TSVs may be reduced up to some ten microns. However, this reduction entails an increase of the parasitic phenomena, is the reason for mechanical brittleness of the TSVs, and renders testing thereof difficult.

In addition, TSVs are typically provided by means of somewhat complex production processes, given the need to insulate each TSV electrically from the surrounding semiconductor, and to provide a through hole. In particular, given a wafer of semiconductor material, typically the TSVs are created by means of chemical etching following upon formation, in the wafer, of the integrated circuits. In addition, the creation of the TSVs is followed by an operation of reduction of thickness or grinding of the bottom surface of the wafer (operation known as "back grinding") in order to render the vias through silicon vias. This operation inevitably entails a reduction in the thickness of the wafer. Hence, in order to prevent breaking of the wafer, before the grinding operation a protective layer, having the function of bestowing mechanical stiffness on the wafer, is laid on the top surface of the wafer, to which the protective layer is attached by interposition of an adhesive layer.

SUMMARY

In order to overcome at least in part the TSV problems described above, SiPs have been proposed comprising integrated circuits provided with an appropriate transmitter-receiver (known as either "transceiver" or "transponder" according to whether it uses in transmission and reception a single frequency or else two different frequencies, respectively) and with a transmitting and receiving antenna ("transceiving antenna"), typically embedded in the integrated circuit and in general of the loop type (with single loop or multiple loops), even though alternatively it is possible to use also other types of antennas, such as, for example, Hertzian dipoles, or else interfaces of a capacitive type.

The transmitter-receiver is electrically coupled to the transceiving antenna so that it is able to receive signals received by and directed to the transceiving antenna so as to enable the integrated circuit to communicate with other integrated circuits within the SiP, and possibly also with electronic devices external to the SiP.

Operatively, two or more integrated circuits communicate with one another thanks to the coupling that is set up between the corresponding transceiving antennas. According to the distance between the transceiving antennas and to the frequency at which these antennas operate, the coupling may be of a magnetic type or else electromagnetic type. In the case of electromagnetic coupling, the transceiving antennas are coupled by means of electromagnetic waves generated thereby. Instead, in the case of magnetic coupling, coupling occurs by means of generation and concatenation, by the transceiving antennas, of a variable flux of magnetic field (magnetic flux), i.e., the transceiving antennas function alternatively as primary or secondary winding of a transformer. For the purposes of the present disclosure, the type of coupling is not important; consequently, reference will generically be made to a "coupling". In addition, hereinafter the expression "electromagnetic field" will be used with generic reference to the electromagnetic radiation or to the (variable) magnetic field generated by the transceiving antennas.

In order to improve the overall performance, and in particular to improve the coupling between the transceiving antennas of different integrated circuits, the U.S. patent application Ser. No. 12/182,893, filed on Jul. 30, 2008 and incorporated by reference, describes SiPs additionally provided with one or more electromagnetic expansions, i.e., one or more pairs of additional antennas, coupled by a matching electrical network and configured so as to couple with one or more transceiving antennas of corresponding integrated circuits, or else of corresponding external electronic devices.

The use of electromagnetic expansions enables improvement of the coupling between the transceiving antennas of different integrated circuits, or else between the transceiving antenna of one integrated circuit and an external electronic device. In the absence of electromagnetic expansions, the coupling is rather weak given that frequently set between the transceiving antennas of the integrated circuits are semiconductor regions, oxide regions and, above all, metal regions, which function as electromagnetic shield, reducing the coupling between the transceiving antennas.

In order to improve the coupling between the transceiving antennas, U.S. patent application Ser. No. 12/182,893, which is incorporated by reference moreover describes, together with the use of electromagnetic expansions, the adoption of a magnetic core set within a SiP, outside the integrated circuits contained in the SiP and in such a way as to improve the coupling between the electromagnetic expansions of the SiP. Possibly, the magnetic core may project from the SiP so as to improve the coupling with external electronic devices.

Even though previously proposed solutions have yielded rather satisfactory results, they are characterized by a certain complexity of production.

An embodiment of the present disclosure provides an integrated electronic device that enables at least partial solution of the drawbacks of the known art.

BRIEF DESCRIPTION OF THE DRAWINGS

For a better understanding of the disclosure, embodiments thereof are now described purely by way of non-limiting example and with reference to the attached drawings, wherein:

FIG. 1 is a cross section of a diagram of principle of an embodiment of an integrated electronic device;

FIG. 3 shows a diagram of principle of an embodiment of a SoC;

FIGS. 4a, 4b, 5, 6, 8, 16a, 16b, 16c, 21, 23 and 24 are schematic representations of cross sections of embodiments of integrated electronic devices;

FIGS. 7a and 7b are schematic representations, respectively, of a cross section and a top view of an embodiment of one and the same integrated electronic device;

FIGS. 9, 10a and 10b show cross sections of diagrams of embodiments of principles of SiPs;

FIG. 15 is a schematic representation of a cross section of an embodiment of an electronic system;

FIGS. 17 and 19a are schematic representations of embodiments of a probe card and, of a support for testing of integrated electronic devices;

FIG. 18 is a schematic representation of an embodiment of a support for testing integrated electronic devices;

FIG. 20 is a schematic representation of a view from beneath an embodiment of a plurality of integrated electronic devices.

DETAILED DESCRIPTION

Figure 2:
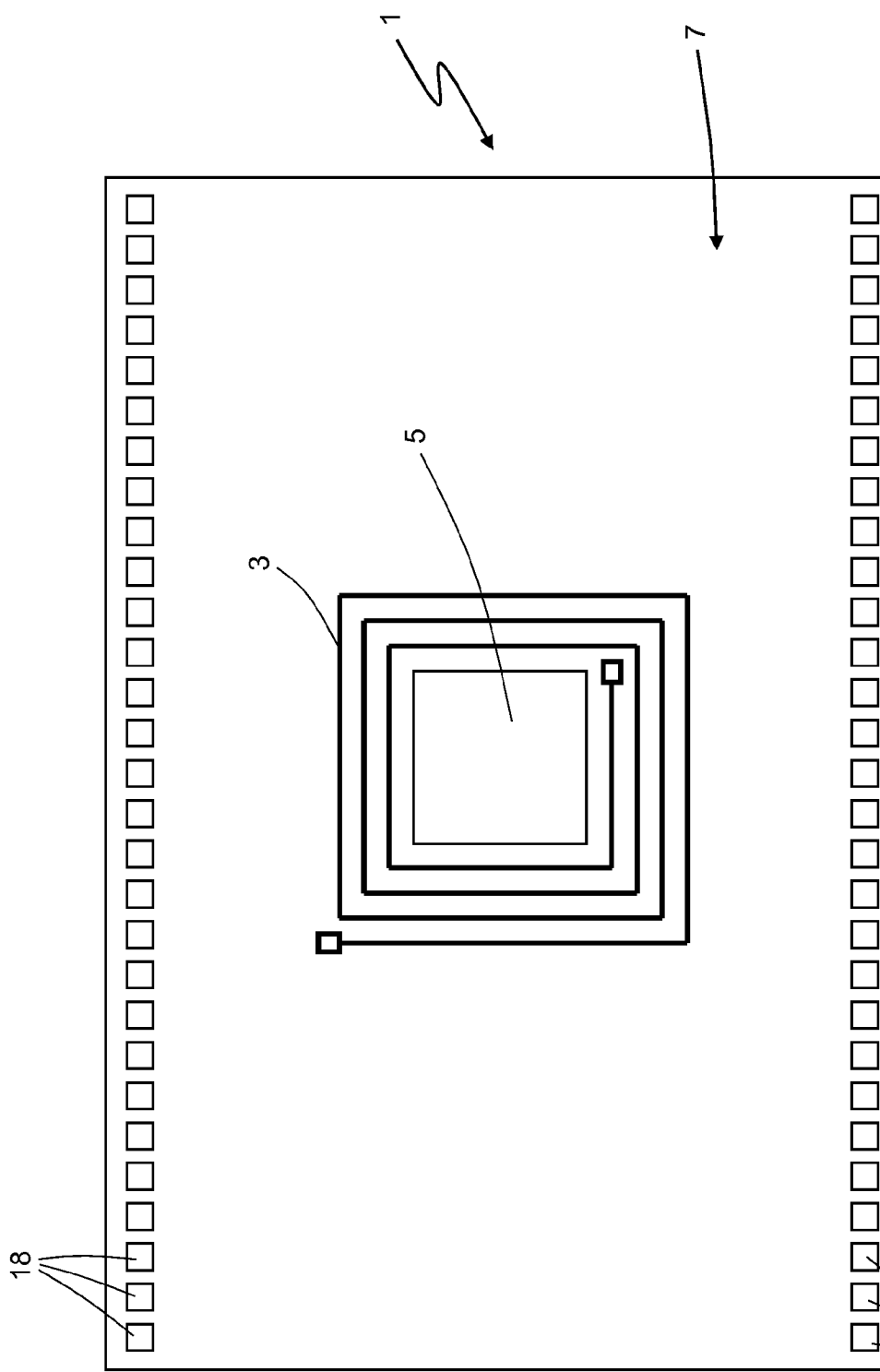
FIG. 2 shows a top view of a diagram of principle of an embodiment of an integrated electronic device.

FIG. 1 is a schematic representation of an embodiment of an integrated electronic device 1 formed by a body 2, a transceiving antenna 3, and a magnetic via 4.

The body 2 has a top surface 7, a bottom surface 8, and a side surface 12, and has, in top view (see, for example, FIG. 2) a rectangular or circular or polygonal shape. In addition, the body 2 comprises one or more layers of semiconductor material and possibly one or more layers of dielectric or metal material (not shown in FIG. 1), these layers being designed to provide an integrated electronic circuit. In addition, a portion of the body 2, shown schematically in FIG. 1, provides an integrated transceiving circuit 10. The integrated transceiving circuit is electrically coupled to the transceiving antenna 3 and enables the integrated electronic device 1 to receive and transmit electromagnetic signals by means of the transceiving antenna 3.

The transceiving antenna 3 is integrated in the integrated electronic device 1 and extends within the body 2, facing the top surface 7.

The magnetic via 4 extends vertically in a region of the body 2 located underneath the transceiving antenna 3, from which it is electrically uncoupled. The magnetic via 4 has the shape, for example, of a truncated pyramid or of a truncated cone set upside down; consequently, it has a top base 5, a bottom base 6, and a height h, and is filled with magnetic material, i.e., material that has ferromagnetic characteristics and a relative magnetic permeability μr that is very high (in general much greater than 1), for example, greater than 10, at the frequency or frequencies of interest.

As is shown in FIG. 2, the transceiving antenna 3 may be a loop antenna, formed by at least one level of one or more concentric, coplanar loops made of conductive material and having a circular or polygonal shape in top view. In addition, the integrated electronic device 1 may present pads 18, in a way similar to the integrated circuits according to the known art. These pads 18 may be used for connecting the integrated electronic device 1 to other electronic devices, or else to supply power to the integrated electronic device 1.

As is shown schematically in FIG. 3, the integrated electronic device 1 may comprise one or more cores embedded in the same body 2, in the case in point four integrated electronic circuits, hereinafter referred to as cores C1-C4, each of which forms a unit (which may be a memory, a processor, etc.) and which are appropriately intercoupled (the connections are not shown). At least one of these units, in the case in point the core C1, is electrically coupled to the integrated transceiving circuit 10 so as to be able to send and receive electromagnetic signals by means of the transceiving antenna 3. In this particular embodiment, the integrated electronic device 1 is a SoC equipped with at least one wireless communication channel.

As is shown in FIGS. 4a and 4b, the transceiving antenna 3 may be of a helical type, i.e., formed by a winding of conductive material (solenoid) comprising at least one level of loops (two, in the embodiment shown, but there could also be a single loop or a number of loops) arranged vertically and along one and the same longitudinal axis 11, which coincides, for example, with the longitudinal axis of the magnetic via 4. The loops may have any shape such as a circular or polygonal shape; in addition, the winding may be set either above the magnetic via 4 (FIG. 4a) or around the magnetic via 4 (FIG. 4b), in which case the magnetic via 4 may extend vertically in the body 2 starting from the top surface 7 of the integrated electronic device 1, hence with the top base 5 and the top surface 7 coplanar. It may be noted, moreover, that in FIGS. 4a and 4b there is highlighted in a schematic way the presence, within the body 2, of a substrate 9 made of semiconductor material, and of a top region 19 superimposed on the substrate 9. The substrate 9 may be made of semiconductor material and may comprise one or more epitaxial layers of semiconductor material (not shown). Instead, the top region 19 is formed, for example, by metal regions, possible dielectric layers, possible polysilicon regions, etc. (not shown). From a practical point of view, one or more integrated electronic circuits, for example the cores C1-C4 shown in FIG. 3, may be formed in the body 2. Possibly, and in a way in itself known, these integrated electronic circuits may be coupled to other circuits via one or more pads 18 arranged on the top surface 7 of the integrated electronic device 1, within which there will be at least one conductive path 13. In the embodiments shown, the magnetic via 4 extends both through the substrate 9 and through the top region 19, even though other embodiments are possible, such as embodiments in which the magnetic vias extend only in the substrate 9.

It may be noted that the bottom base 6 of the magnetic via 4 may be coplanar to the bottom surface 8 (FIGS. 4a, 4b) or else lie inside the body 2, as in the embodiment shown in FIG. 5. In the case where the top base 5 and the bottom base 6 of the magnetic via 4 are coplanar, respectively, with the top surface 7 and the bottom surface 8 of the body 2, the magnetic via 4 is a through via.

The integrated electronic device 1 may comprise more than one magnetic via 4. For example, the embodiment shown in FIG. 6 has four magnetic vias, designated by 4a-4d, organized in two vertical magnetic structures, designated by 14a, 14b, each one formed by two magnetic vias 4a-4d. Within one magnetic structure 14a, 14b, for example, the magnetic structure 14a, a first magnetic via 4a and a second magnetic via 4b are stacked on top of one another and in direct contact with one another, i.e., with the bottom base 6b of the second magnetic via 4b in contact with the top base 5a of the first magnetic via 4a; the area and the geometrical shape of the bases 5a, 6b may be different. The transceiving antenna 3 is set so as to surround, with its own winding, the magnetic vias 4b, 4d closer to the top surface 7. Also possible are embodiments (not shown) with a greater number of magnetic vias and/or magnetic structures, or else embodiments (not illustrated) in which the magnetic vias of a magnetic structure are not in contact. Again, embodiments are possible (not illustrated) with more than one magnetic via, in which the transceiving antenna is set so as to overlie the magnetic vias, without surrounding them, in a way similar to what is shown in FIGS. 4a and 5.

As is shown in FIGS. 7a and 7b, the integrated electronic device 1 may moreover comprise one or more of the following elements: a top coating layer 15, made of magnetic material and set on top of, and in direct contact with, the top surface 7, in such a way that it overlies the transceiving antenna 3; and one or more magnetic-confinement vias 20, i.e., magnetic vias extending within the body 2 starting from the top surface 7, possibly in contact with the magnetic coating layer 15 (if present), and set laterally with respect to the transceiving antenna 3, for example, at the vertices of a hypothetical square, or else along the sides of this hypothetical square. The magnetic-confinement vias 20 have generally the same shape as the magnetic vias 4, but are of smaller dimensions. In particular, in the embodiment shown in FIGS. 7a and 7b a first magnetic via 4a and a second magnetic via 4b are present, set in stacked mode, with the second magnetic via 4b that overlies the first magnetic via 4a and is in direct contact both with the first magnetic via 4a and with the top coating layer 15. The transceiving antenna 3 is of the winding type and is set outside the second magnetic via 4b. The top coating layer 15 overlies the transceiving antenna 3 and four magnetic-confinement vias 20, arranged according to the vertices of a square (FIG. 7b), outside the transceiving antenna 3 and in direct contact with the top coating layer 15.

Instead of the magnetic-confinement vias 20, it is possible to use a trench (not shown) filled with magnetic material, extending in the body 2 underneath the coating layer 15 starting from the top surface 7, and with a circular or polygonal shape in top view. This trench, which surrounds the second magnetic via 4b, may moreover be segmented, i.e., discontinuous.

Moreover possible are embodiments (not illustrated) similar to the one shown in FIGS. 7a, 7b, but in which the magnetic-confinement vias 20 extend in the body 2 until they are in direct contact with the top base 5a of the first magnetic via 4a.

The function of the top coating layer 15, of the trench and/or of the magnetic-confinement vias 20 is that of creating a preferential magnetic path for the electromagnetic field generated by the transceiving antenna 3 so as to reduce the electromagnetic emissions of the integrated electronic device 1 and the adverse effects induced by any possible electromagnetic interference on the integrated electronic device 1.

Figure 8:
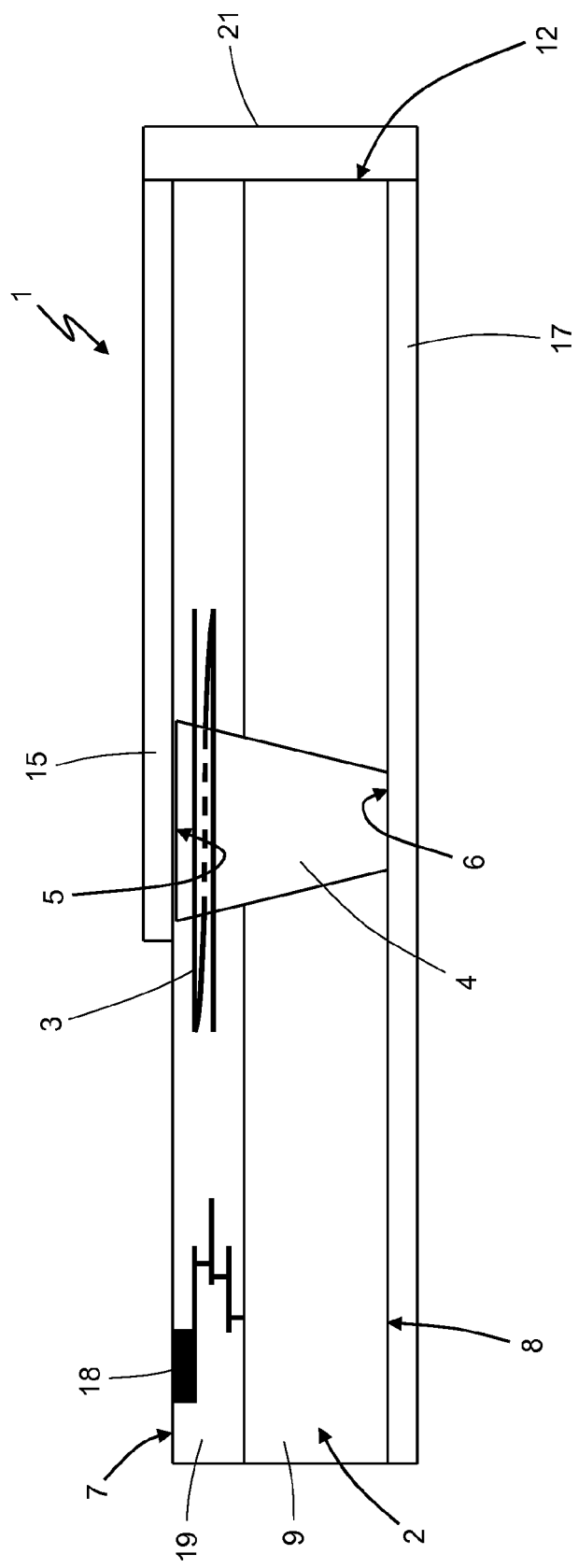

The magnetic path may be a closed path (magnetic circuit), such as, for example, in the case of the embodiment shown in FIG. 8. In this embodiment there is present, in addition to the transceiving antenna 3, to the magnetic via 4, and to the top coating layer 15, a bottom coating layer 17, which is also made of magnetic material and underlies the bottom surface 8, with which it is in direct contact. In addition, a side coating layer 21 is present, set in contact with at least one part of the side surface 12 of the body 2, it being possible for this layer to be in direct contact with the top coating layer 15 and/or with the bottom coating layer 17. By way of example, in the case of a body 2 having a polygonal shape, in top view, the side coating layer 21 may extend laterally at least on one part of a side face of the body 2.

In the embodiment shown in FIG. 8, the magnetic via 4 is of a through type and is in direct contact both with the top coating layer 15 and with the bottom coating layer 17. However, embodiments are possible in which the magnetic via 4 is not of a through type, and in which the transceiving antenna 3 is set between the top coating layer 15 and the magnetic via 4.

It may likewise be noted that, instead of the side coating layer 21, it is possible to close the magnetic path using, in addition to the magnetic via 4, a second magnetic via, which is not necessarily of a through type, or else a vertical magnetic structure formed by two or more magnetic vias (not necessarily in direct contact), extending in the body 2 outside the magnetic via 4, possibly in direct contact with the top coating layer 15 and/or with the bottom coating layer 17.

It may be noted that in all the embodiments described in the present document, including the ones not illustrated, the magnetic vias 4 and the top coating layer 15, the bottom coating layer 17, and the side coating layer 21, which in what follows will be referred as a whole as "magnetic components", may be made entirely of magnetic material, or else may be obtained by embedding particles of magnetic material in an appropriate host material, such as, for example, a polymer, a polyimide, a resin, an adhesive or sticky substance, etc. In addition, embodiments are possible in which some magnetic components are made entirely of magnetic material, whilst other magnetic components are formed by particles of magnetic material embedded in a host material.

It may moreover be noted that, in all the embodiments described, the transceiving antenna 3 may be used by the integrated electronic device 1 not only for communicating with other electronic devices, including other integrated electronic devices 1 of the type described, but also for receiving power designed to supply the integrated electronic device 1 itself via the electromagnetic energy that flows through the wireless communication channel.

FIG. 9 shows a SiP 25 comprising a package 26 and, within the package 26, an integrated electronic device, here designated by 1a, an integrated circuit 1x, an adhesive layer 27, a supporting layer 29, two bondings 30, which enable supply of the integrated electronic device 1a and of the integrated circuit 1x, and a plurality of bumps 31, which enable connection of the SiP 25 to external electronic devices. In turn, the integrated electronic device 1a and the integrated circuit 1x comprise, respectively, a first transceiving antenna 3a and a second transceiving antenna 3b. In addition, the integrated electronic device 1a comprises a magnetic via 4, set with respect to the first transceiving antenna 3a in any one of the ways described above.

In detail, the supporting layer 29 carries the integrated circuit 1x, which in turn carries, by means of interposition of the adhesive layer 27, the integrated electronic device 1a. The integrated electronic device 1a and the integrated circuit 1x are arranged in back-to-face mode, i.e., the bottom surface of the integrated electronic device, here designated by 8a, faces the top surface of the integrated circuit 1x, here designated by 7x, with the result that the magnetic via 4 is set between the first transceiving antenna 3a and the second transceiving antenna 3b, thus improving the coupling between them.

Operatively, the magnetic via 4 provides a communication channel between the integrated electronic device 1a and the integrated circuit 1x. The communication channel may be used, by adopting electrical or electromagnetic communication techniques in themselves known, for performing high-bit rate communications between the integrated electronic device 1a and the integrated circuit 1x.

In order to improve further the coupling between the first transceiving antenna 3a and the second transceiving antenna 3b, it is possible to embed at least in a portion of the adhesive layer 27, set between the magnetic via 4 and the second transceiving antenna 3b, particles of magnetic material, thus improving a communication channel also in the case where the first and second transceiving antennas 3a and 3b are not perfectly aligned.

Even though they are not illustrated, both the integrated electronic device 1a and the electronic circuit 1x may present one or more TSVs. The integrated circuit 1x may in turn be coupled to the supporting layer 29, and hence be supplied by means of bumps instead of wire bonding, in which case the integrated electronic device 1a may be in turn supplied not by means of bonding, but rather by appropriate bumps (not shown in any of the figures), used by the integrated electronic device 1a for electrical connection to the integrated circuit 1x.

Once again with reference to FIG. 9, the integrated electronic device 1a and the integrated circuit 1x may be set in reversed positions, i.e., with the integrated circuit 1x superimposed on the integrated electronic device 1a. In this case, the integrated electronic device 1a is set with the transceiving antenna 3 facing the supporting layer 29, i.e., the integrated circuit 1x and the integrated electronic device 1a are set according to a face-to-back arrangement, with the top surface of the integrated circuit 1x facing the bottom surface 8a of the integrated electronic device 1a. In this way, the magnetic via 4 of the integrated electronic device 1a is in any case set between the first transceiving antenna 3a and the second transceiving antenna 3b so as to improve coupling thereof.

FIG. 10a shows a SiP 25 comprising a package 26, contained inside which are a first integrated electronic device 1a and a second integrated electronic device 1b, set stacked, with the first integrated electronic device 1a overlying the second integrated electronic device 1b, an adhesive layer 27, set between the first and second integrated electronic devices 1a, 1b, a supporting layer 29, which carries the second integrated electronic device 1b, a first plurality of bumps 31, set between the second integrated electronic device 1b and the supporting layer 29, and a second plurality of bumps 31, arranged on a bottom surface of the package 26. The second plurality of bumps 31 enables supply of the SiP 25 and/or electrical connection thereof to external electronic devices, whilst the first plurality of bumps 31 enables electrical connection of the second integrated electronic device 1b to the supporting layer and, hence, supply thereof.

The first and second integrated electronic devices 1a, 1b comprise, respectively, a first transceiving antenna 3a and a first magnetic via 4a, and a second transceiving antenna 3b and a second magnetic via 4b. The respective top surfaces are designated by 7a and 7b, whilst the respective bottom surfaces are designated by 8a and 8b.

The first and second integrated electronic devices 1a, 1b are arranged in back-to-back mode, with the bottom surface 8a of the first integrated electronic device 1a facing the bottom surface 8b of the second integrated electronic device 1b, in such a way that the first and second magnetic vias 4a, 4b are set between the first transceiving antenna 3a and the second transceiving antenna 3b, thus improving coupling thereof.

It is noted that both in the embodiment illustrated in FIG. 9 and in the one illustrated in FIG. 10a, the transceiving antennas 3a, 3b, illustrated schematically, may be arranged so as to be superimposed on the corresponding magnetic vias 4a, 4b or else so as to surround them partially, in a way similar to what occurs in the case of the embodiments shown in FIGS. 4b and 6. In addition, each integrated electronic device 1a, 1b may have more than one magnetic via, with shapes and arrangements according to any one of the embodiments described in the present document.

In order to improve further the coupling between the first and second magnetic vias 4a, 4b, it is possible to embed, at least in a portion of the adhesive layer 27, particles of magnetic material, thus guaranteeing a communication channel also in the case where the first and second magnetic vias 4a and 4b are not perfectly aligned.

The first integrated electronic device shown in FIGS. 9 and 10a may be supplied via the wireless communication channel. For example, the second integrated electronic device 1b may generate, via the transceiving antenna 3b, a variable electromagnetic field having an energy such as to supply to the first integrated electronic device 1a the power necessary for operation. Possibly, the energy may be supplied from the outside of the SiP 25.

Figure 10B:
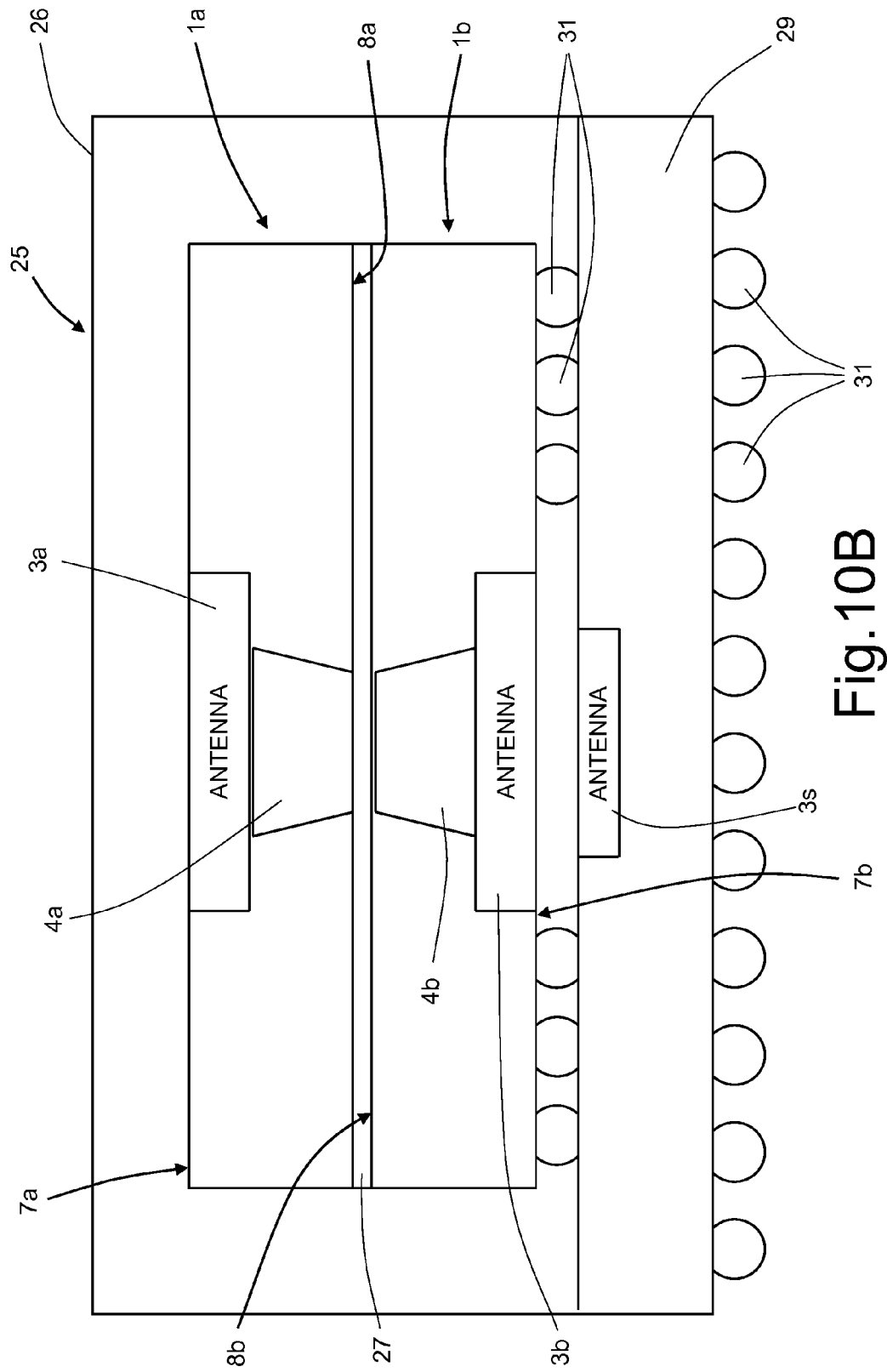

In turn, the second integrated electronic device 1b may be supplied by means of a further antenna 3s, which is electromagnetically coupled with the second transceiving antenna 3b, as shown in FIG. 10b. The further antenna 3s may be arranged within the supporting layer 29; in addition, the further antenna 3s may be vertically aligned with the first and second transceiving antennas 3a, 3b. Further embodiments (not shown) are possible, in which the coupling between the further antenna 3s and the second transceiving antenna 3b is enhanced by means of magnetic cores arranged, e.g., in the supporting layer 29.

In the case where the SiP 25 comprises at least two integrated electronic devices 1a, 1b, they may be coupled in ways different from those mentioned previously. For example, the integrated electronic devices may be stacked in face-to-face mode, or else may be set alongside one another, with interposition of a communication channel obtained by using at least one between the top coating layer 15, the bottom coating layer 17, and the side coating layer 21. In addition, between the integrated electronic devices there may be set one or more magnetic cores.

Figure 11:
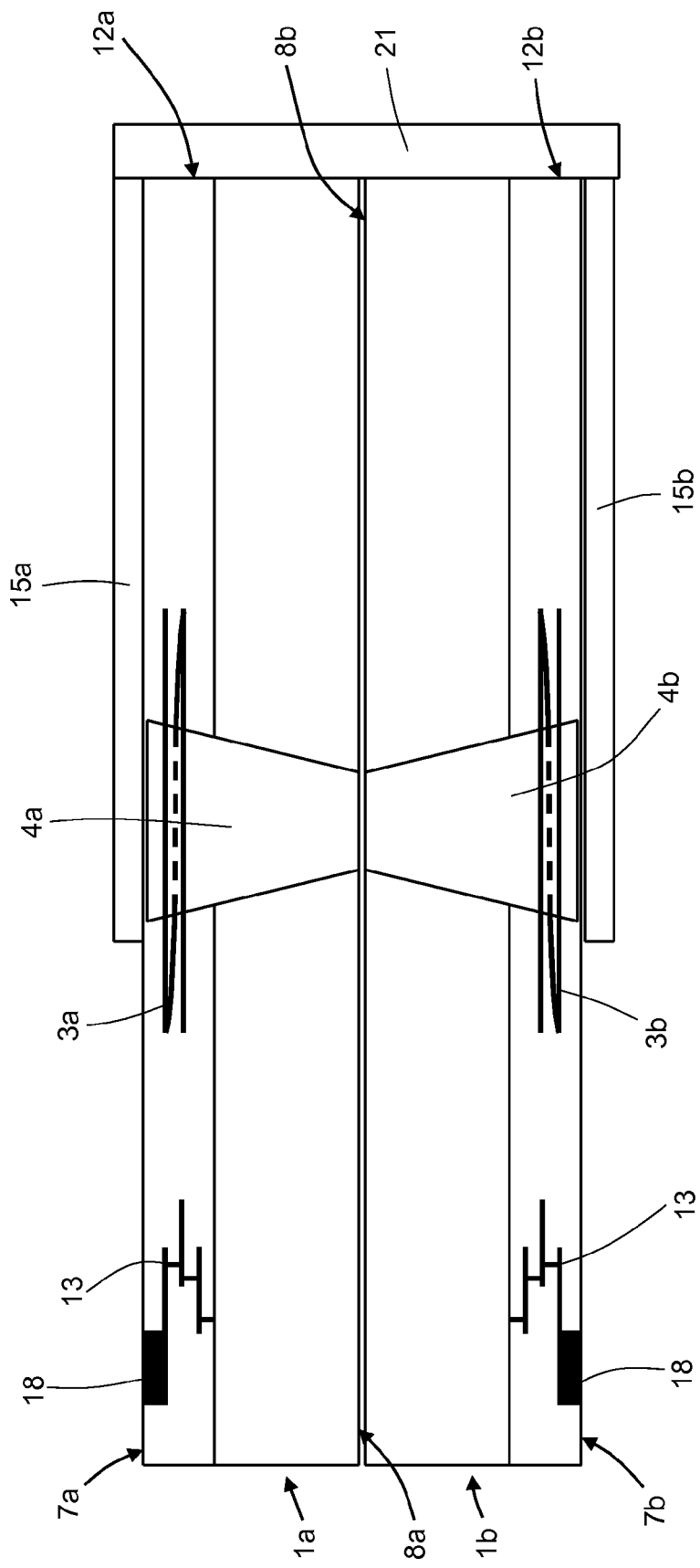
FIGS. 11-14 and 22 are schematic representations of cross sections of embodiments of sets of two integrated electronic devices.

As is shown in FIG. 11, in the presence of at least two integrated electronic devices, in the case in point the first integrated electronic device 1a and the second integrated electronic device 1b, for example, forming part of a SiP (not shown), it is possible to close the magnetic path present between the respective transceiving antennas 3a, 3b by using a side coating layer 21, made of magnetic material.

In detail, the first and second integrated electronic devices 1a, 1b are similar to those of the embodiment shown in FIG. 4b, and comprise, respectively, a first transceiving antenna 3a and a first magnetic via 4a, and a second transceiving antenna 3b and a second magnetic via 4b. In addition, the first and second electronic devices 1a, 1b are set on top of one other as in the embodiment shown in FIG. 10a. As compared to the embodiment shown in FIG. 4b, the first and second integrated electronic devices 1a, 1b comprise, respectively, a first top coating layer 15a and a second top coating layer 15b, made of magnetic material.

Both the first top coating layer 15a and the second top coating layer 15b overlie, respectively, the first magnetic via 4a and the second magnetic via 4b, and extend laterally as far as in a position corresponding, respectively, to a first side surface 12a of the integrated electronic device 1a, and a second side surface 12b of the second integrated electronic device 1b. In the case where the bodies of the first and second integrated electronic devices 1a, 1b have a polygonal shape, in top view, the first and second side surfaces 12a, 12b are, for example, side faces corresponding of these bodies of the first integrated electronic device 1a and of the second integrated electronic device 1b.

In the embodiment illustrated in FIG. 11, likewise present is a side coating layer 21, made of magnetic material, in direct contact with at least part of the first and second side surfaces 12a, 12b, and extending vertically so as to be in direct contact both with the first top coating layer 15a and with the second top coating layer 15b. Embodiments are in any case possible in which the aforementioned layers are not in direct contact.

Operatively, the first and second magnetic vias 4a, 4b, the first and second top coating layers 15a, 15b and the side coating layer 21 enable formation of a closed magnetic path for the electromagnetic field, improving coupling between the first transceiving antenna 3a and the second transceiving antenna 3b.

Albeit not shown, it is moreover possible to arrange the first and second integrated electronic devices 1a, 1b in back-to-face mode and/or use, instead of the side coating layer 21, additional magnetic vias, laterally staggered with respect to the first and second magnetic vias 4a, 4b, and extending, respectively, in the first integrated electronic device 1a and in the second integrated electronic device 1b, for example, along one and the same axis, and being of a through type.

It is noted that in all the embodiments with more than one integrated electronic device 1 it is possible to set between the integrated electronic devices 1 one or more layers of magnetic material. In addition, in the case of SiPs, it is possible to insert within the package one or more cores of magnetic material, having shapes and arrangements such as to optimize coupling between the transceiving antennas of the integrated electronic devices 1. One or more of these magnetic cores may have a portion projecting outside the package of the SiP so as to enable coupling of one or more integrated electronic devices inside the SiP with possible external electronic devices.

Figure 13:
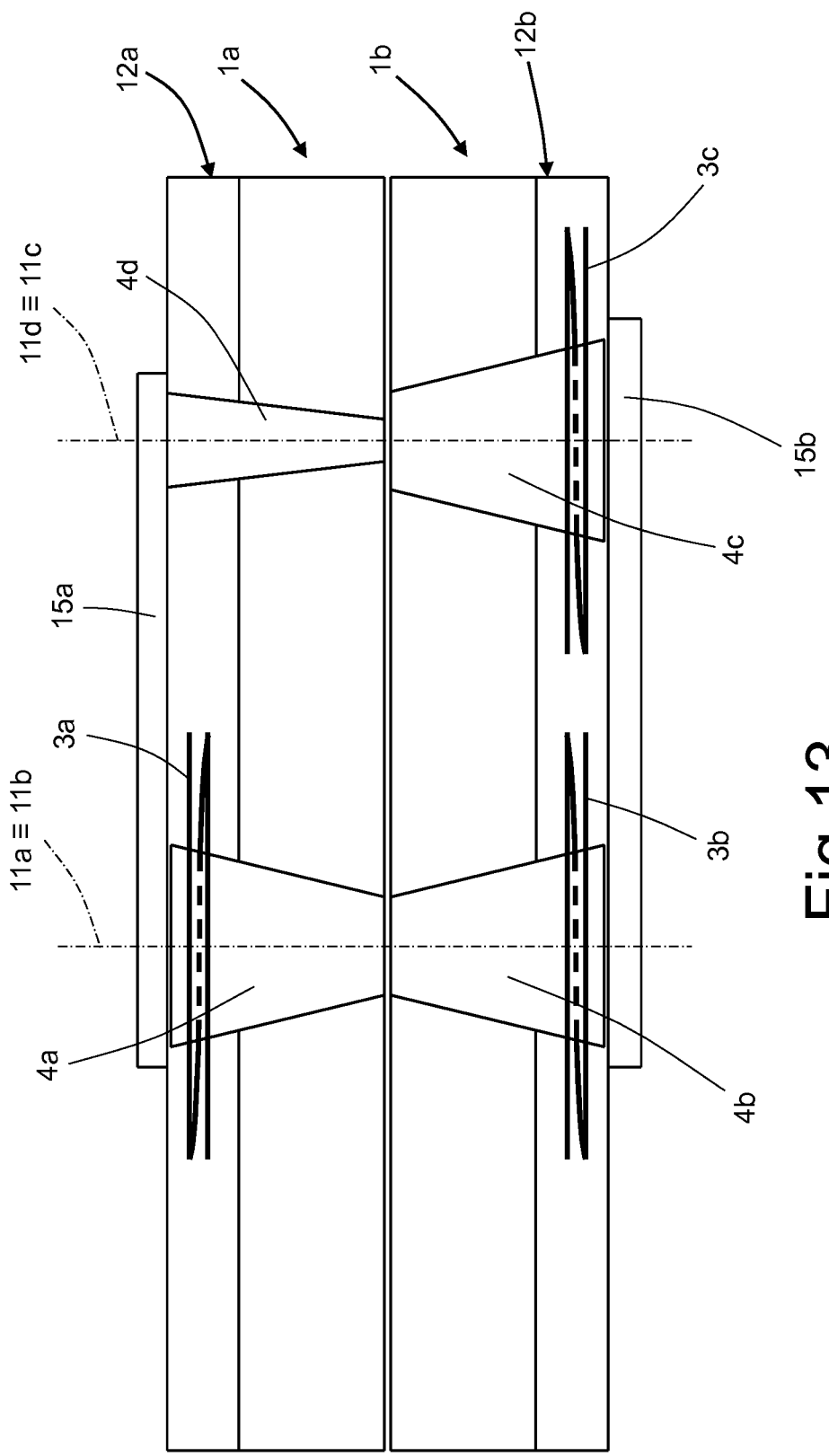
Figure 14:
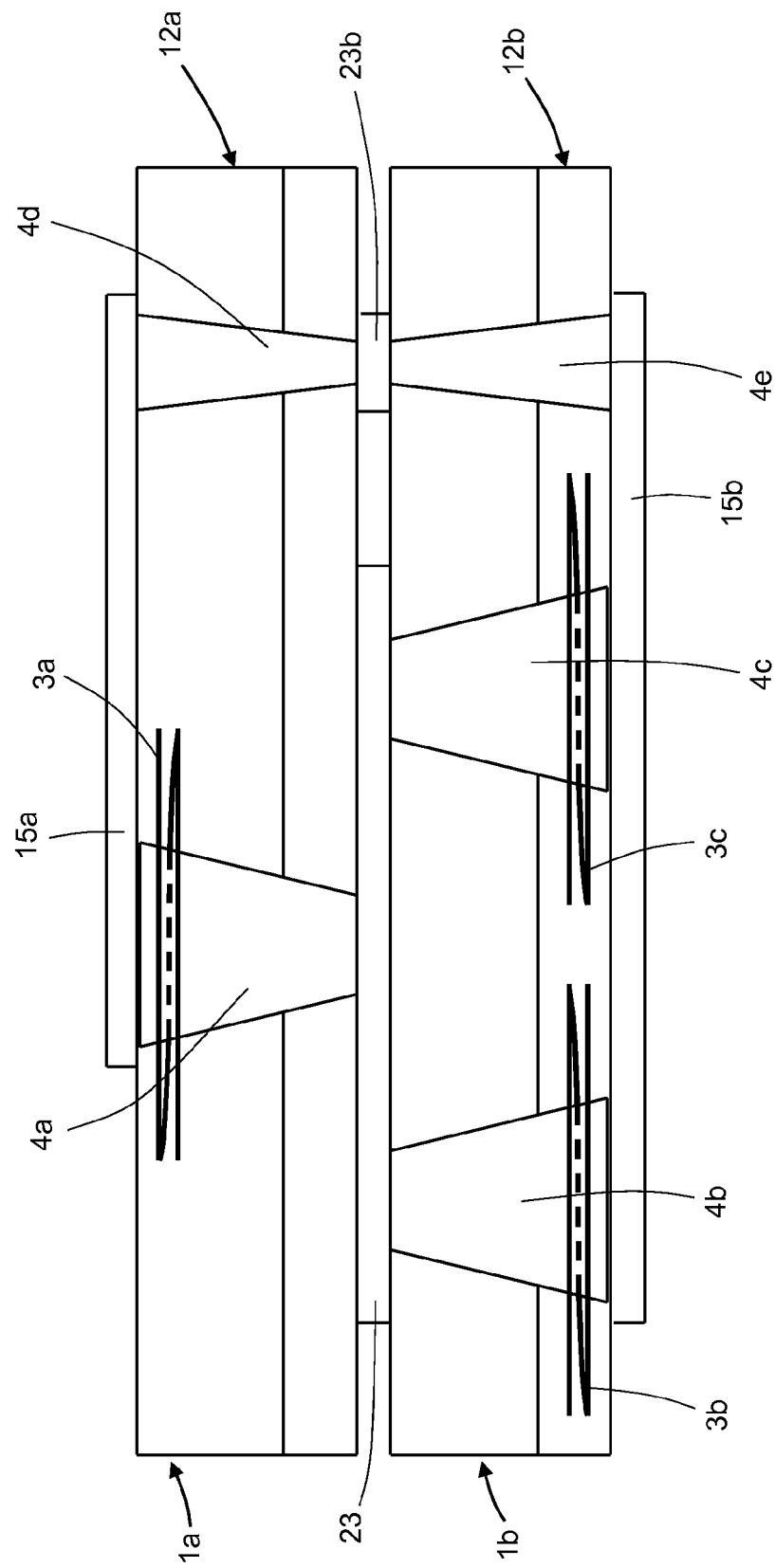

Moreover possible are embodiments in which one or more integrated electronic devices comprise more than one transceiving antenna 3. Purely by way of example, FIGS. 12-14 show sets of two integrated electronic devices, for example included in a SiP (not shown) and formed, in the case in point, by a first integrated electronic device 1a and a second integrated electronic device 1b, set in stacked, back-to-back, mode, with the first integrated electronic device 1a that overlies the second integrated electronic device 1b.

Figure 12:
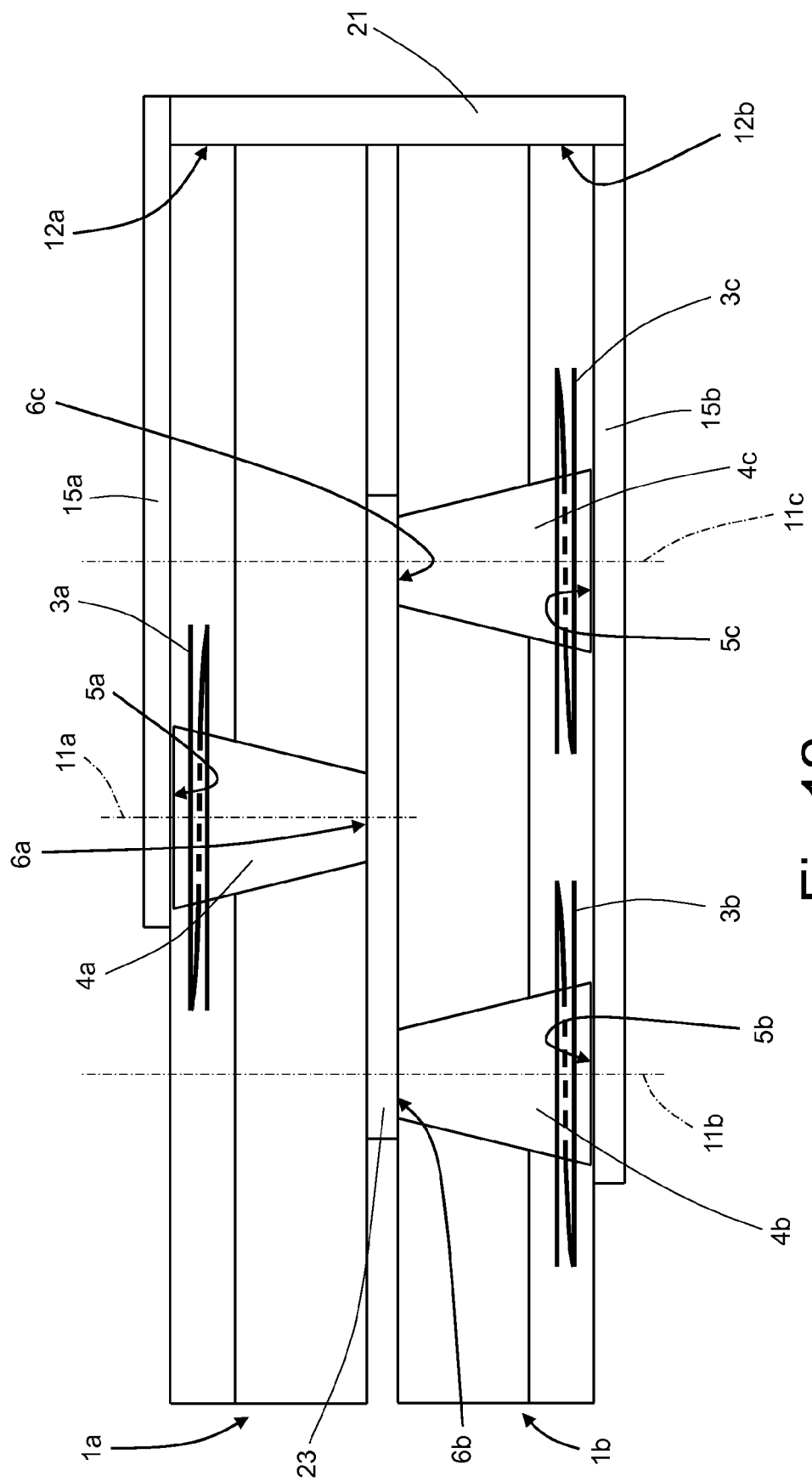

FIG. 12 shows an embodiment similar to the embodiment shown in FIG. 11, but in which the second integrated electronic device 1b comprises, in addition to the second magnetic via 4b and to the second transceiving antenna 3b, a third magnetic via 4c, which is a through via and is laterally staggered with respect to the second magnetic via 4b, and a third transceiving antenna 3c, of the winding type, which extends in the body 2b of the second integrated electronic device 1b so as to partially surround the third magnetic via 4c.

The first magnetic via 4a of the first integrated electronic device is laterally staggered with respect to the second and third magnetic vias 4b, 4c, i.e., its axis 11a is parallel to and comprised between the axes 11b, 11c of the second magnetic via 4b and of the third magnetic via 4c. In addition, present between the first and second integrated electronic devices 1a, 1b is an intermediate magnetic layer 23, not present in the embodiment shown in FIG. 11, made of magnetic material. The intermediate magnetic layer 23 extends laterally so as to overlie the second and third magnetic vias 4b, 4c, and underlying the first magnetic via 4a, i.e., given the back-to-back arrangement of the first and second integrated electronic devices 1a, 1b and the through nature of the magnetic vias 4a-4c, so as to contact the bottom bases of the first, second, and third magnetic vias 4a, 4b, 4c, here designated, respectively, by 6a, 6b, and 6c. Embodiments are in any case possible in which the layer 23 is not in direct contact with the magnetic vias.

Operatively, the second and third transceiving antennas 3b, 3c may be assimilated to two secondaries of a transformer, set in parallel with respect to the electromagnetic field generated by the primary of the transformer, in the case in point represented by the first transceiving antenna 3a. In this way, communication channels are thus provided between the first transceiving antenna 3a and the second transceiving antenna 3b and between the first transceiving antenna 3a and the third transceiving antenna 3c.

As compared with what is shown in FIG. 12, in the embodiment illustrated in FIG. 13 the first integrated electronic device 1a comprises additionally a fourth magnetic via 4d, which is also of a through type and is laterally staggered with respect to the first magnetic via 4a. In addition, the first and fourth magnetic vias 4a and 4d, i.e., the respective axes 11a and 11d, as likewise the second and third magnetic vias 4b, 4c, i.e., the respective axes 11b and 11c, are laterally staggered with respect to one another in such a way that the first and second magnetic vias 4a, 4b, and the third and fourth magnetic vias 4c, 4d will be set coaxial with respect to one another.

Once again with reference to the embodiment shown in FIG. 13, as compared to the embodiment shown in FIG. 12, the side coating layer 21 is absent. In addition, the first and second top coating layers 15a, 15b extend laterally so as to overlie, respectively, the first and fourth magnetic vias 4a, 4d and the second and third magnetic vias 4b, 4c, without reaching, respectively, the first and second side surfaces 12a, 12b as in the embodiment shown in FIG. 12.

Operatively, the first, second, third, and fourth magnetic vias 4a-4d, and the first and second top coating layers 15a, 15b form a magnetic circuit, i.e., a closed magnetic path, which enables optimization of the coupling present between the first, second, and third transceiving antennas 3a-3c. The first transceiving antenna 3a behaves in a way similar to the primary of a transformer, whereas the second and third antennas 3b, 3c may be assimilated as two secondaries of the transformer, which, unlike what is shown in FIG. 12, are set in series with respect to the electromagnetic field generated by the primary.

As is shown in FIG. 14, also possible are embodiments in which, as compared to the embodiment illustrated in FIG. 12, the first integrated electronic device 1a additionally comprises a fourth magnetic via 4d, and in which the second integrated electronic device 1b has a fifth through magnetic via 4e, coaxial with respect to the fourth magnetic via 4d and laterally staggered with respect to the second and third magnetic vias 4b, 4c.

In this particular embodiment, the side coating layer 21 is not present. In addition, the first and second top coating layers 15a, 15b extend laterally so as to overlie, respectively, the first and fourth magnetic vias 4a, 4d, and the second, third, and fifth magnetic vias 4b, 4c, 4e, without reaching, respectively, the first and second side surfaces 12a, 12b. Once again, in a position corresponding to the fourth and fifth magnetic vias 4d, 4e, set between the first and second integrated electronic devices 1a, 1b is a further intermediate magnetic layer 23b so as to enable closing of the magnetic circuit of the magnetic path through the fourth and fifth magnetic vias 4d, 4e.

Consequently possible are embodiments in which one or more integrated electronic devices have more than one transceiving antenna and more than one magnetic via, whereby each of the integrated electronic devices 1 may connect up to one or more electronic devices, whether they be integrated electronic devices of the type described, or else electronic circuits according to the known art, equipped with respective transceiving antennas.

The electronic systems, such as, for example, SiPs, that contain one or more integrated electronic devices of the type described, may additionally comprise an electromagnetic expansion (not shown), formed by at least two "expansion" antennas coupled to one another by an electrical or electromagnetic network. A first antenna of this expansion is designed to couple to at least one external electronic device, whilst the second antenna of this expansion is designed to replicate the signals possibly received by this at least one external electronic device to at least one transceiving antenna of at least one integrated electronic device inside the SiP. The coupling between the second antenna of the electromagnetic expansion and this at least one transceiving antenna is improved by interposition of at least one magnetic via, as described previously.

With reference to FIGS. 11 to 14, embodiments are possible (not illustrated) in which at least one transceiving antenna is set so as to overlie the respective magnetic via, without surrounding it, in a way similar to what is shown in FIGS. 4a and 5. Further embodiments are possible, in which at least an integrated electronic device among the first and second integrated electronic devices 1a, 1b does not comprise any magnetic via, but possibly comprises a magnetic path for example formed by particles of magnetic material embedded in a host material.

FIG. 15 illustrates an electronic system 40 of the package-on-package type, comprising a first package 41a and a second package 41b set in stacked mode and containing, respectively, a first integrated electronic device 1a and a second integrated electronic device 1b of the type described previously and comprising, respectively, a first transceiving antenna 3a and a first magnetic via 4a, and a second transceiving antenna 3b and a second magnetic via 4b.

The first and second packages 41a, 41b contain, respectively, a first magnetic core 43a and a second magnetic core 43b, made at least partially of magnetic material and overlying, respectively, the first and second integrated electronic devices 1a, 1b. In addition, the first and second packages 41a, 41b have, respectively, a first bottom surface 42a and a second bottom surface 42b. Present on the first bottom surface 42a is a first plurality of bumps 31, whereby the first integrated electronic device 1a may connect electrically up to the second integrated electronic device 1b. Present on the second bottom surface 42b is a second plurality of bumps 31, whereby the second integrated electronic device 1b may connect electrically up to other external electronic devices, or else to a printed-circuit board (PCB). In addition, present on the first and second bottom surfaces 42a, 42b are, respectively, a third magnetic core and a fourth magnetic core, arranged so as to underlie, respectively, the first and second magnetic vias 4a, 4b. Consequently, present between the first transceiving antenna 3a and the second transceiving antenna 3b are the first magnetic via 4a, the second magnetic core 43b, and the third magnetic core 43c, so as to improve coupling between the first transceiving antenna 3a and the second transceiving antenna 3b.

It is moreover possible for there to be present, inside one package, at least one magnetic core, close to or in direct contact with the magnetic via 4a and/or with the transceiving antenna 3a. The magnetic core may moreover be set close to at least one outer surface of the package itself, and possibly project through the outer surface so as to extend on the outside of the package. Alternatively, the magnetic core may be buried in the package underneath the outer surface.

The outer surface may also be a side surface of the package itself, and hence it is possible to set alongside one another at least two packages, thus creating a wireless communication channel through two side surfaces of the two packages, between which there may be present at least one further magnetic core external to the two packages themselves.

There may thus be created a magnetic path or circuit between the two packages.

In FIG. 15, the presence of the bumps 31 between the first and second packages 41a, 41b is optional. In fact, the integrated electronic devices 1a, 1b may be coupled also only by means of the wireless communication channel provided by the first magnetic via 4a, and by the second and third magnetic cores 43b, 43c. In this case, the integrated electronic device 1a obtains the power necessary for its operation from the energy that flows through the wireless communication channel.

The wireless communication channel may be used also in the case of packages 41a, 41b of a different type, for example provided with leads instead of the bumps 31, and also in the case where one or more integrated electronic devices are coupled to the leads or to the bumps 31 by means of appropriate wire bonding or bumps (not shown), possibly coupled to the substrate of the package itself. Furthermore, the first and second packages 41a, 41b may be stacked in face-to-face mode (not shown), namely with the package 41a top surface facing the package 41b top surface, so that no bump is present between the first and second packages 41a, 41b, which are coupled only by means of the first and second antennas 3a, 3b.

Two different printed circuit boards (PCB) or substrates may be electrically coupled to the packages 41a and 41b by means of the bumps 31.

The electronic system 40 of the package-on-package type may be coupled by means of one or more wireless-communication channels with another electronic system 40 of the package-on-package type, or else with an external package containing an integrated electronic device 1 according to any one of the embodiments described.

The external package and the electronic system 40, and in general at least two packages, may be arranged, respectively, on a first face and a second face of a PCB, in which there may be present at least one magnetic core for creating a wireless communication channel between the first and second faces of the PCB. In addition, between the external package and the electronic system 40 there may be inserted at least one electromagnetic expansion.

In all the embodiments described, it is possible to use, instead of the magnetic vias of the type described, one or more magnetic vias of a different shape. For example, the magnetic vias may be parallelepipedal, cylindrical, or else be shaped like a prism with polygonal base. In addition, as illustrated by way of example in FIG. 16a, it is possible to use an hybrid magnetic via, designated by 50 and comprising a magnetic via 4 of the type described previously, a conductive coating 51 which extends laterally with respect to the magnetic via 4 and is made of electrically conductive material, and an insulating coating 52 which extends laterally with respect to the conductive coating 51 and is made of insulating material. The conductive coating 51 provides a sort of TSV, which is insulated from the body 2 of the integrated electronic device 1 thanks to the presence of the insulating coating 52. The hybrid magnetic via 50 is hence electrically insulated from the body 2 of the integrated electronic device 1 and may be used for transmitting signals in the form of electric currents.

As illustrated in FIG. 16b, the conductive coating 51 may be absent from the hybrid magnetic via 50. In this case, the hybrid magnetic via 50 may be formed by a core portion 53, which may be made of a material having good characteristics simultaneously of electrical conductivity and magnetic permeability, such as, for example, cobalt and alloys thereof, or nickel and alloys thereof. The core portion 53 may have the shape, for example, of a truncated pyramid or of a truncated cone set upside down. The insulating coating 52 extends laterally with respect the core portion 53, thereby insulating the core portion 53 from the body 2.

Furthermore, as illustrated in FIG. 16c, both the conductive coating 51 and the insulating coating 52 may be absent from the hybrid magnetic via 50. In this case, the magnetic via 4 within the hybrid magnetic via 50 is hollow and houses a TSV 75 of a type in itself known, which extends vertically from the top base 5 to the bottom base 6 of the magnetic via 4. The TSV 75 is electrically insulated from the body 2 thanks to the material of the magnetic via 4, which, in this embodiment, may be chosen with a low conductibility.

As is shown by way of example in FIG. 17, the integrated electronic devices 1 described, and in particular the magnetic vias 4 contained therein, may be tested by using a probe card 60 and a support 65, this latter being generally known as chuck 65.

FIG. 17 shows, in addition to the probe card 60 and to the chuck 65, a portion of a wafer 100 of semiconductor material, formed in which is a plurality of integrated electronic devices 1. By way of example, of this plurality a first integrated electronic device 1a and a second integrated electronic device 1b are shown, which comprise, respectively, a first transceiving antenna 3a and a first magnetic via 4a, and a second transceiving antenna 3b and a second magnetic via 4b. The top surfaces of these integrated electronic devices 1a, 1b are designated, respectively, by 7a and 7b, whilst the corresponding bottom surfaces are designated, respectively, by 8a and 8b.

In detail, the probe card 60 comprises a printed circuit board PCB (not shown), a supporting head 61 and a plurality of probes or contact terminals 62, extending from the supporting head 61 and designed to be electrically coupled to corresponding pads or bumps of the integrated electronic devices 1a, 1b. In a way in itself known, a first number of these contact terminals 62 has the function of supplying the integrated electronic devices 1a, 1b, and of sending test signals thereto, whilst a second number of these contact terminals 62 has the function of collecting signals of response to these test signals. The probe card 60 is coupled in a way in itself known, and consequently not shown, to an automatic test equipment (ATE) 101 (FIG. 19b), from which the probe card 60 receives the test signals and to which it sends the response signals collected by means of its own contact terminals 62, in such a way that the ATE 101 is able to process these response signals and, finally, supply information regarding operation of the integrated electronic devices 1a, 1b. The connection between the probe card 60 and the ATE 101 may comprise an appropriate interface, in itself known.

The chuck 65 has a top surface 67, extending underneath which is a supporting layer 69, made of magnetic material and designed to carry the wafer 100. The wafer 100 is positioned on the chuck 65 in such a way that the transceiving antennas 3 of the integrated electronic devices 1 face the probe card 60, i.e., with the bottom surfaces 8 in contact with the supporting layer 69.

In the case illustrated in FIG. 17, each integrated electronic device 1 comprises a single magnetic via 4. Consequently, it is possible to test the magnetic vias 4 testing sets of two or more integrated electronic devices, as described by way of example with reference to the first and second integrated electronic devices 1a, 1b. Operatively, by means of the contact terminals 62, the first and second integrated electronic devices 1a, 1b are supplied in such a way that the first transceiving antenna 3a generates an electromagnetic field, which, thanks to the presence of the magnetic vias 4a, 4b and of the supporting layer 69, is concatenated at least in part by the second transceiving antenna 4b. By conducting at least one appropriate test, and in particular by sending test signals to the first integrated electronic device 1a and collecting response signals from the second integrated electronic device 1b (or vice versa), it is possible to verify the behavior of the magnetic vias 4a, 4b and of the corresponding transceiving circuits. Consequently, a way to test the magnetic vias 4a, 4b is obtained by verifying proper coupling between the first and second integrated electronic devices 1a, 1b.

In addition, in the case (not shown) where present within at least one integrated electronic device is a first transmitting antenna and two receiving antennas that receive the electromagnetic signals transmitted by the first antenna, or else, vice versa, in the case where there are present two transmitting antennas and one receiving antenna, it is possible to test clusters of magnetic vias formed by three or more magnetic vias.

It may be noted that, in the case where the integrated electronic devices 1 are of the low-power type, it is not necessary to supply them by means of the probe card 60. In fact, as illustrated in FIG. 18, it is possible to adopt a chuck 65 comprising, in addition to the supporting layer 69, a winding 70 made of conductive material, which is set underneath the supporting layer 69 and may be coupled to an appropriate power supply, for example, of the radiofrequency type, possibly incorporated in the ATE 101. The winding 70 generates, when supplied, an electromagnetic field that is concatenated by at least one pair of transceiving antennas 3 (in the case in point, the first transceiving antenna 3a and the second transceiving antenna 3b) so that the respective integrated electronic devices extract therefrom power useful for their own operation.

Coupling between the transceiving antennas 3 and the winding 70 is improved by the presence of the supporting layer 69. In addition, as shown once again in FIG. 18, the chuck 65 may comprise a connection region 72, made of magnetic material and set between the supporting layer 69 and the winding 70 so as to optimize the coupling between the winding 70 and the transceiving antennas 3. There may then be present further parts (not shown) made of magnetic material, which have the purpose of creating a closed magnetic circuit comprising the chuck 65 and at least part of the wafer 100.

In the case of supply via the chuck 65, the integrated electronic devices 1a, 1b are provided with respective built-in self-test (GIST) circuits, of a type in itself known, such that, when supplied by means of the magnetic winding 70, the integrated electronic devices 1a, 1b receive the test signals and transmit the response signals through the respective transceiving antennas 3a, 3b so that it will be possible for these test/response signals to be transmitted/received by the winding 70, or else by at least one further winding (not shown), similar to the winding 70 and coupled in turn to the ATE 101. The further winding may be set on the chuck 65, or else may be set on the wafer 100 (not necessarily in contact therewith), and possibly may interface with the wafer 100 via an electromagnetic expansion (not shown), or else via a magnetic core.

It may be noted that, in the previously described cases, instead of adopting the chuck 65 equipped with the supporting layer 69, it is possible to resort to a traditional chuck, depositing, however, on the back of the wafer 100, i.e., on the bottom surfaces 8 of the integrated electronic devices 1, a layer of magnetic material (not shown), which, when the wafer 100 is set on the chuck 65, contacts with the chuck 65 and performs the functions of the supporting layer 69.

It is likewise noted that, in the case (not illustrated) where the integrated electronic devices 1 present on the wafer 100 have each at least two magnetic vias 4 laterally staggered and associated, respectively, to a first transceiving antenna 3a and a second transceiving antenna 3b (see, for example, the second integrated electronic device 1b shown in FIG. 12), testing of the at least two magnetic vias 4 of each of the aforementioned integrated electronic devices 1 may be made individually, by conducting the test on one integrated electronic device 1 considered at a time. For example, in the case of testing by means of the probe card 60, it is possible to supply the considered integrated electronic device 1 in such a way that the first transceiving antenna 3a, on the basis of the appropriate test signals, will generate an electromagnetic field and collect, once again by means of the probe card 60, response signals indicating how the electromagnetic field is concatenated by the second transceiving antenna 3b. In addition, it is possible to test simultaneously a plurality of magnetic vias 4 belonging to a plurality of integrated electronic devices 1.

Figure 19A:
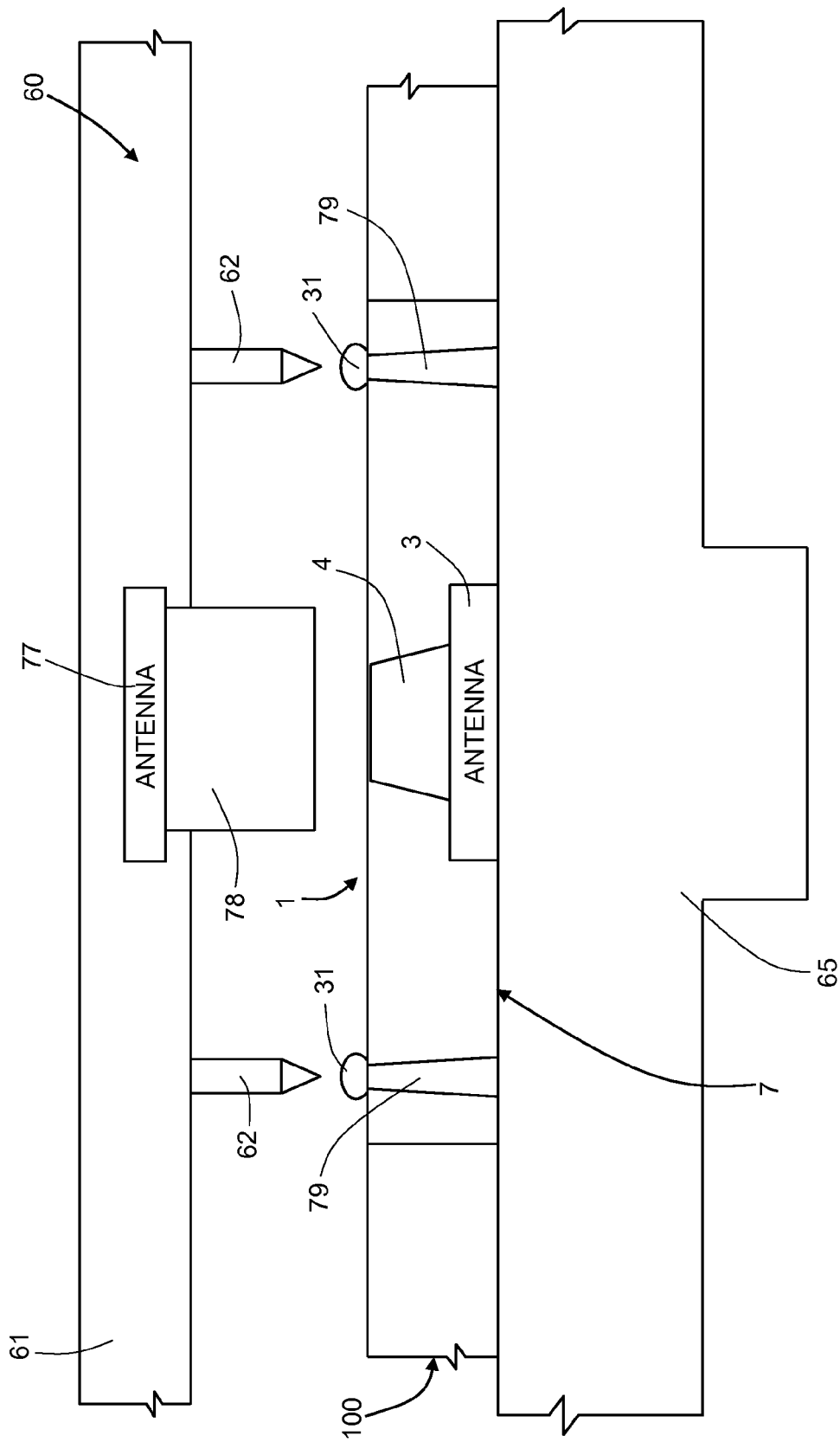

As illustrated in FIG. 19a, in the case where one or more integrated electronic devices 1 of the wafer 100 present one or more TSVs (herein indicated by 79) of a traditional type, and it is intended to verify proper operation both of the TSVs 79 and of the magnetic vias 4, it is expedient to provide the wafer 100 on the chuck 65 in such a way that the top surfaces 7 are in direct contact with the chuck 65 in such a way that the contact terminals 62 of the probe card 60 are able to contact the TSVs 79, for example, by means of appropriate bumps 31.

As is shown once again in FIG. 19a, in the case where the integrated electronic devices 1 present, respectively, a single magnetic via 4 and a single transceiving antenna 3, it is possible to use a traditional chuck 65 and a probe card 60 provided not only with contact terminals 62, but also with at least one test antenna 77, for example housed inside the supporting head 61, and with a possible magnetic core 78, which extends underneath the test antenna 77 and protrudes from the supporting head 61 towards the chuck 65.

It is thus possible to test the magnetic vias 4 individually by approaching the probe card 60 to the chuck 65 in such a way that the core 78 is brought into the proximity of a magnetic via 4 of an integrated electronic device 1 to be tested, which is supplied by the contact terminals 62. Thanks to the presence, between the transceiving antenna 3 of the integrated electronic device 1 to be tested and the test antenna 77, of a magnetic path comprising the magnetic core 78 and the magnetic via 4, it is possible to test the magnetic via 4 on the basis of the coupling present between the transceiving antenna 3 and the test antenna 77. For example, it is possible to cause emission by the test antenna 77 of an electromagnetic stimulation signal, which, in the presence of a magnetic via 4 properly obtained, is received by the transceiving antenna 3 in such a way that within the integrated circuit provided in the integrated electronic device 1 there occurs reception of the test signals, which, once collected by means of appropriate connection terminals 62, enable diagnosis of proper operation of the magnetic via 4 and of the circuits of the integrated electronic device 1 itself.

Clearly, it is possible for the probe card 60 to have more than one test antenna 77 and more than one magnetic core 78 so as to be able to test a plurality of magnetic vias 4 of a plurality of integrated electronic devices 1 individually.

Alternatively (case not shown), it is possible to use, in addition to a traditional chuck 65, a probe card 60 without the test antenna 77, but equipped with at least one magnetic core 78 extending underneath the supporting head 61 so as to overlie at least two magnetic vias 4 of at least one integrated electronic device 1. In this case, testing of the at least one integrated electronic device 1 and of the respective at least two magnetic vias 4 is performed by supplying by the probe card 60 the at least one integrated electronic device 1 in such a way that the respective at least two transceiving antennas 3 are coupled through the respective magnetic vias 4 and the magnetic core 78.

Also in this case, it is possible for the probe card 60 to have more than one magnetic core 78, so as to test simultaneously a plurality of magnetic vias 4 of a plurality of integrated electronic devices 1.

Figure 19B:
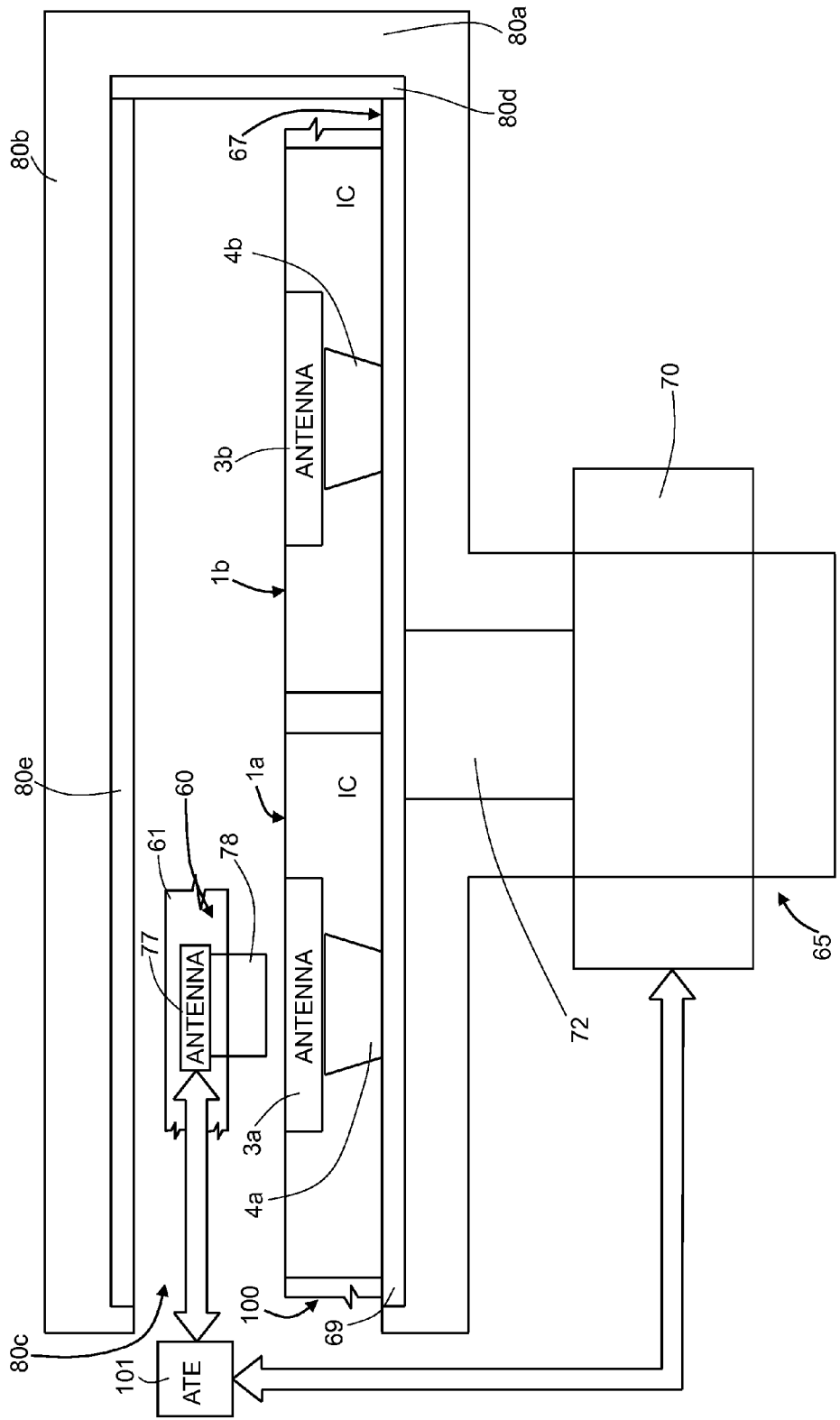
FIG. 19b is a schematic representation of an embodiment of a piece of test equipment, a probe card, and a support for testing of integrated electronic devices.

As shown in FIG. 19b, the chuck 65 may comprise a vertical sidewall 80a, which is coupled to the top surface 67 so as to form a 90° angle with respect to the top surface 67, and an horizontal sidewall 80b, which is coupled to the vertical sidewall 80a. The horizontal sidewall 80b is arranged so as to be parallel to the top surface 67 and to overlie the top surface 67. The top surface 67, the vertical and horizontal sidewall 80a, 80b define an open cavity 80c, which may house the wafer 100 and the probe card 60. The vertical and horizontal sidewalls 80a, 80b may be respectively coated by a first and second additional coating layers 80d, 80e of magnetic material. Furthermore, the first additional coating layer 80d may be coupled to the supporting layer 69; the second additional coating layer 80e may be coupled to the first additional coating layer 80d, so that the open cavity 80c is internally coated by magnetic material, thereby improving the coupling between the test antenna 77 and a possible integrated electronic device to be tested.

As further alternative, once again in the case where the integrated electronic devices 1 each present, in addition to a number of TSVs, a single magnetic via 4 and a single transceiving antenna 3, it is possible to resort to a traditional chuck 65 and probe card 60, and apply on the back of the wafer 100, i.e., on the bottom surfaces 8 of the integrated electronic devices 1, a plurality of connection strips 81, made of magnetic material (for example, a glue containing magnetic particles) and arranged so as to connect, each, at least two magnetic vias 4, as is shown by way of example in FIG. 20. Also in this case, testing of the magnetic vias 4 is carried out at least in pairs, not necessarily adjacent, by supplying with the probe card 60 at least two integrated electronic devices 1 electromagnetically coupled by a connection strip 81.

The connection strips 81 may connect electromagnetically with one another more than two magnetic vias 4, thus creating at least one cluster of magnetic vias 4 of different electronic devices 1, which are thus electromagnetically coupled with one another. In addition, it is not necessary to remove the connection strips 81 once the test has been completed.

In the case, not illustrated, where the integrated electronic devices 1 present on the wafer 100 have, instead, at least two magnetic vias 4 laterally staggered and associated respectively to at least one first transceiving antenna and one second transceiving antenna 3, it may be sufficient for the magnetic core 78, in the case of probe card 60 without test antenna and equipped with magnetic core 78, or else for the connection strip 81, in the case of traditional probe card 60, to extend laterally so as to overlie the at least two magnetic vias 4 of an integrated electronic device 1 in such a way that it may be tested.

The device described enables communication channels of a wireless type to be provided between integrated electronic devices, which may be used for exchanging data and/or for supplying these integrated electronic devices. In particular, the magnetic vias and possibly the coating layers enable improvement of the quality of the communication channels, enabling exchange of data at a high bit rate.

In addition, the embodiments described may present a number of bumps, wire bondings, and TSVs that is smaller than in the known art or even zero, so that they are of contained dimensions, and simple to produce and test.

Finally, it is evident that modifications and variations may be made to the integrated electronic device 1, to the SiP 25, to the package-on-package system 40, as likewise to the testing methods described, without thereby departing from the scope of the present disclosure.

For example, the transceiving antenna 3, instead of extending within the body 2 of the integrated electronic device 1, may be set on the top surface 7.

The magnetic via 4 may have a size, for example, the diameter (in case of magnetic via with circular section), that is sensibly greater than those of TSVs according to the known art. For example, whereas TSVs have generally a diameter in the region of 10 µm, the magnetic via 4 may have a diameter in the region of 100 µm, with consequent simplification of the process of fabrication of the wafer. In fact, in the absence of TSVs, it may not be necessary to perform back grinding of the wafer; in addition, the magnetic via 4 is not traversed by electric current. Consequently, it may not be necessary to insulate it electrically from the substrate of semiconductor material. Again, the presence of magnetic paths within the integrated electronic device 1 does not require the elements forming these magnetic paths (the magnetic vias, the magnetic material coating layers, etc.) to be in direct contact.

Figure 21:
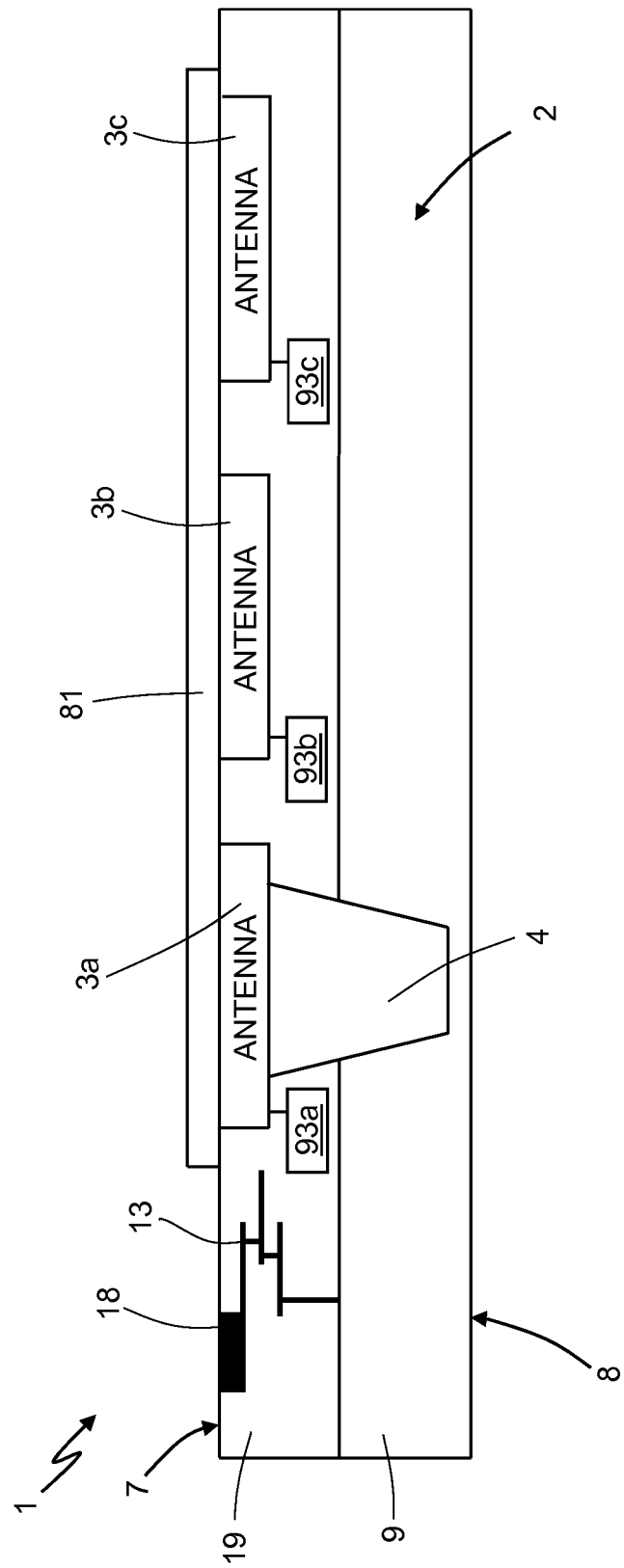

In addition, in order to reduce the area of a generic integrated electronic device 1, it is possible to reduce the number of magnetic vias 4 using at least one connection strip 81, as shown in FIG. 21. In the illustrated embodiment, in addition to the first transceiving antenna 3a and to the magnetic via 4, a second transceiving antenna 3b and a third transceiving antenna 3c are present, laterally staggered with respect to the first transceiving antenna 3a; a connection strip 81 is also present, which extends above the first, second, and third antennas 3a-3c. Furthermore, a first, a second and a third integrated electronic circuits 93a-93c may be formed in the top region 19 (as shown in FIG. 21), or in the body 2 (not shown in FIG. 21). The first, second and third integrated electronic circuits 93a-93c may be respectively coupled with the first, second and third transceiving antennas 3a-3c.

From an operative point of view, through the magnetic via 4 and the first antenna 3a it is possible to supply power to the integrated electronic device 1 (in particular, to the first integrated electronic circuit 93a) and create a wireless communication channel between the antennas 3a, 3b, 3c with at least one further external device or system, thanks to the electromagnetic coupling provided by the connection strip 81. Furthermore, according to an embodiment, the first, second and third integrated electronic circuits 93a-93c may communicate between themselves by means of the wireless communication channel formed by the connection strip 81. The presence of the wireless communication channel enables reduction of the number of electrical interconnections present between the first, second and third integrated electronic circuits 93a-93c, creating a high-performance wireless network within the generic integrated electronic device 1 ("wireless network on chip", WNoC) or in the overall system of which it forms part. In the present case, supposing that the first integrated electronic circuit 93a is externally supplied by means of the first transceiving antenna 3a, the second and third integrated electronic circuits 93b, 93c may be electrically coupled to the first integrated electronic circuit 93a only to be supplied by the first integrated electronic circuit 93a itself, without the need for further electric connections configured to carry signals. Alternatively, also the second and third integrated electronic circuits 93b, 93c may be supplied by means of magnetic or electromagnetic fields focused in the connection strip 81. It is noted that the third antenna 3c and the third integrated electronic circuit 93c are optional. Finally, it is noted that a high-performance wireless network on system (WNoS) may be created in a system comprising the generic integrated electronic device 1 with the WNoC; for example, the WNoS may be created between the generic electronic device 1 and an additional electronic device stacked on the generic electronic device 1.

Figure 22:
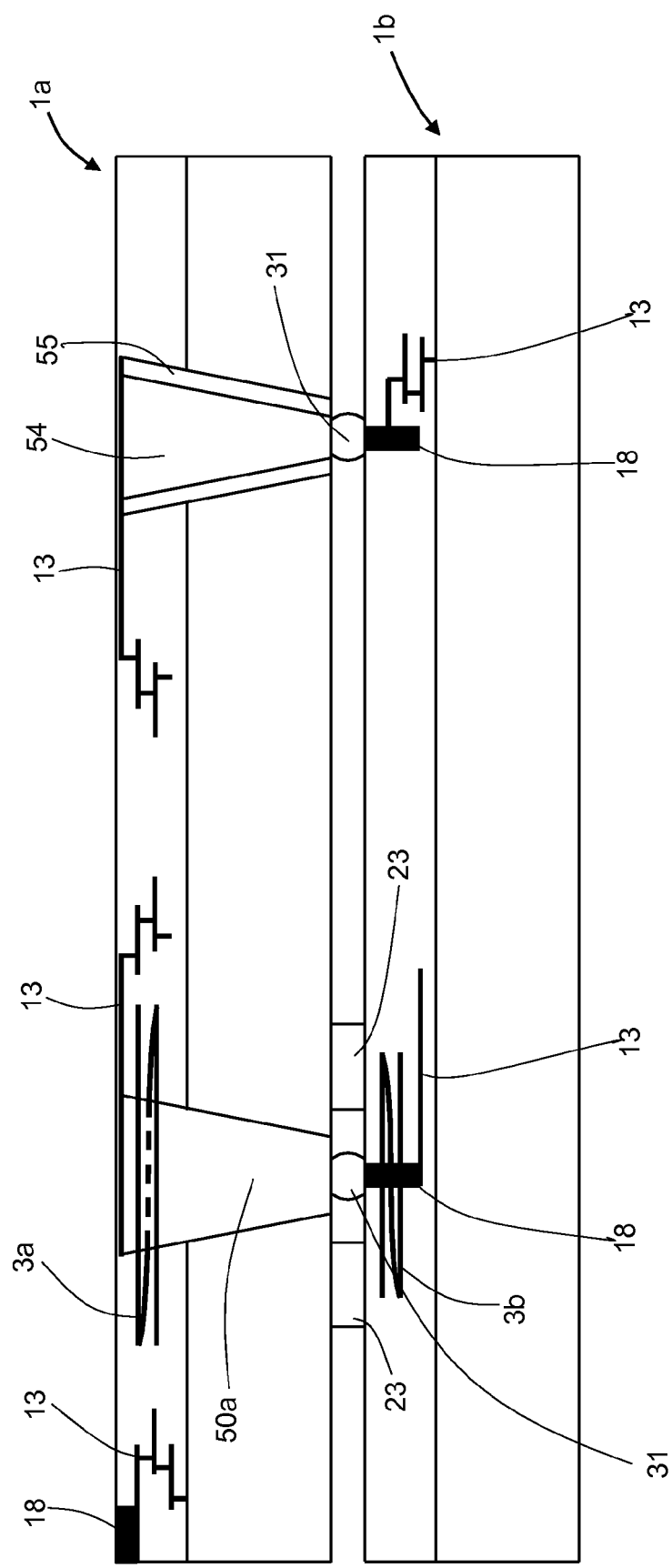

Likewise, embodiments like the one shown in FIG. 22 may be provided, in which the first integrated electronic device 1a and the second integrated electronic device 1b are present. The first integrated electronic device 1a comprises, in addition to a first transceiving antenna 3a, a first hybrid magnetic via, which is herein indicated by 50a. This first hybrid magnetic via 50a may be capable of functioning both as TSV and as magnetic via, and may consequently be traversed by an electric current and by an electromagnetic field. This electric current may supply the second integrated electronic device 1b. The electrical circuit for the electric current is closed through appropriate conductive paths 13, pads 18, and through a second via 54 present in the first integrated electronic device 1a. In the case illustrated, the second via 54 is a TSV, insulated from the substrate by means of its own coating layer 55.

The second integrated electronic device 1b comprises a second transceiving antenna 3b, a conductive path 13, and a pad 18, coupled via a bump 31 to the first hybrid magnetic via 50a. The second integrated electronic device 1b may hence be supplied by the first integrated electronic device 1a and exchange data therewith by means of the first hybrid magnetic via 50a.

Embodiments may be provided having more than two integrated electronic devices 1, contained, for example, within a SiP 25 or within a package-on-package system 40, and arranged in a similar way to what has been described previously.

Furthermore, an embodiment like the one shown in FIG. 23 may be provided, which comprises the transceiving antenna 3, the first hybrid magnetic via 50a, the second via 54 (in the form of a TSV, the respective the coating layer not being shown), and a first and a second connection vias 95a, 95c, each of which is alternatively a metallic via or a hybrid magnetic via. According to this embodiment, a dielectric layer 95b extends underneath the bottom surface 8 of the substrate 9, the first and second connection vias 95a, 95c passing through this dielectric layer 95b. Furthermore, the first connection via 95a and the first hybrid magnetic via 50a are vertically aligned, and the transceiving antenna 3 is arranged underneath the dielectric layer 95b, e.g. vertically aligned with the first hybrid magnetic via 50a and the connection via 95a; conversely, the second connection via 95c is vertically aligned with the second via 54, and is in electrical contact with the second via 54 and the transceiving antenna 3. In the body 2, the first and second integrated electronic circuits 93a, 93b (not necessarily different) are formed, which are in electrical contact respectively with the first hybrid magnetic via 50a and the second via 54. In turn, the first connection via 95a electrically contacts the first hybrid magnetic via 50a and the transceiving antenna 3, thereby allowing a current to flow from the first integrated electronic circuit 93a to the transceiving antenna 3. The current may be drained by the second integrated electronic circuit 93b, through the second via 54, which is electrically coupled to the transceiving antenna 3 by means of the second connection via 95c; of course, the path of the current may be reversed, i.e. the current may flow from the second integrated electronic circuit 93b to the first integrated electronic circuit 93a. According to this embodiment, since the transceiving antenna 3 is arranged underneath the dielectric layer 95b, the electromagnetic interference caused by the transceiving antenna 3 on the first and second integrated electronic circuits 93a, 93b is reduced.

As shown in FIG. 24, another embodiment may be provided, which comprises the first and the second transceiving antenna 3a, 3b, the first hybrid magnetic via 50a and a second hybrid magnetic via 50b. Each of these first and second hybrid magnetic vias 50a, 50b passes through the dielectric layer 95b and extends from the top region 19 up to the first transceiving antenna 3a, which is arranged underneath the dielectric layer 95b. Furthermore, the first and second hybrid magnetic vias 50a, 50b electrically contacts the first transceiving antenna 3a and, respectively, the first and the second integrated electronic circuits 93a, 93b, therefore the current which flows into the first transceiving antenna 3a passes through the first and second hybrid magnetic vias 50a, 50b. According to this embodiment, the second transceiving antenna 3b is arranged next to the top surface 7; further embodiments are possible, in which the second transceiving antenna 3b extends at least in part over the top surface 7. Furthermore, the second transceiving antenna 3b may be coupled to one or more integrated electronic circuits among the first and second integrated electronic circuits 93a, 93b, or a further integrated electronic circuit (not shown).

Finally, hybrid embodiments are possible, which may be obtained by combining two or more of the embodiments described, or parts thereof.

As regards testing of the integrated electronic devices 1, for example grown on the wafer 100 in such a way that the respective magnetic vias 4 are arranged along the vertices of a hypothetical lattice with rectangular mesh, the connection strips 81 may be arranged in such a way that passing in a position corresponding to each magnetic via 4 are at least two connection strips, for example perpendicular with respect to one another and parallel, respectively, to the sides of the rectangular mesh, so as to create a grid of electromagnetically coupled electronic devices 1. Alternatively, the connection strips may be arranged so as to form closed paths, for example, rectangular paths with four magnetic vias 4 at the vertices.

As regards the probe card 60, the magnetic core 78 may comprise, in the case where the probe card presents at least one test antenna 77, a coating of electrically conductive material so as to function both as electrical probe and as magnetic probe. Likewise, the magnetic core 78 may be hollow so as to house a region of electrically conductive material. Alternatively, the magnetic core 78 may be replaced by at least one electromagnetic expansion.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:
1. A semiconductor structure, comprising:
a semiconductor layer having top and bottom surfaces;
a first magnetic region disposed inside the semiconductor layer and having top and bottom surfaces;
a first insulating layer over the top surface of the first semiconductor layer;
a first winding formed wholly within said insulating layer above the top surface of the semiconductor layer and aligned with the first magnetic region;
a second insulating layer mounted beneath the bottom surface of the semiconductor layer; and
a second winding formed wholly within said second insulating layer and aligned with the first magnetic region.

2. The semiconductor structure of claim 1 wherein the first magnetic region comprises a material having a magnetic permeability that is significantly greater than one.

3. The semiconductor structure of claim 1 wherein the first magnetic region comprises a magnetic material.

4. The semiconductor structure of claim 1 wherein the first magnetic region comprises:
a non magnetic material; and
particles of magnetic material disposed in the non magnetic material.

5. The semiconductor structure of claim 1 wherein the first magnetic region includes a hollow portion.

6. The semiconductor structure of claim 1 wherein the first magnetic region is electrically conductive.

7. The semiconductor structure of claim 1, further comprising a conductive region at least partially disposed inside of the first magnetic region.

8. The semiconductor structure of claim 1, further comprising a conductive region disposed at least partially around the first magnetic region.

9. The semiconductor structure of claim 1 wherein the first magnetic region has an encircling side wall and the winding is disposed to surround the encircling side wall of the first magnetic region.

10. The semiconductor structure of claim 1 wherein the top surface of the first magnetic region extends above the top surface of the semiconductor layer.

11. The semiconductor structure of the claim 1, further comprising: a second magnetic region that is configured to magnetically couple the first winding to the second winding.

12. The semiconductor structure of claim 1, further comprising an additional semiconductor layer having top and bottom surfaces, wherein the bottom surface of the additional semiconductor layer is between the bottom surface of said semiconductor layer and the second insulating layer.

13. The semiconductor structure of claim 12, further comprising: a second magnetic region disposed inside the additional semiconductor layer.

14. A system, comprising:
a first integrated circuit including:
a first semiconductor layer having top and bottom surfaces;
a first magnetic region disposed in the first semiconductor layer and having top and bottom surfaces, wherein the bottom surface of the first magnetic region is located within the semiconductor layer proximate to but spaced apart from the bottom surface of the first semiconductor layer;
an insulating layer over the top surface of the first semiconductor layer; and
a first winding formed wholly within said insulating layer above the top surface of the first semiconductor layer and defining an inner region that is at least partially aligned with the first magnetic region; and
a second integrated circuit coupled to the first integrated circuit.

15. The system of claim 14 wherein the first and second integrated circuits are disposed on a same die.

16. The system of claim 14 wherein the first and second integrated circuits are disposed on respective dies.

17. The system of claim 14 wherein one of the first and second integrated circuits comprises a controller.

18. The system of claim 14 wherein:
the second integrated circuit comprises:
a second semiconductor layer;
a second magnetic region disposed in the second semiconductor layer; and
a second winding defining an inner region that is at least partially aligned with the second magnetic region; and
wherein the second integrated circuit is positioned relative to the first integrated circuit to allow magnetic coupling between the first and second windings.

19. The system of claim 14, further comprising:
a package; and
wherein the first and second integrated circuits are disposed within the package.

20. The system of claim 14, further comprising:
a package; and
wherein the first and second integrated circuits are stacked within the package.

21. A communications structure, comprising:
a first semiconductor substrate;
a first magnetic region disposed within the first semiconductor substrate;
a first insulating layer over a top surface of the first semiconductor substrate;
a first winding within said first insulating layer;
a second semiconductor substrate;
a second insulating layer over a top surface of the second semiconductor substrate;
a second winding within said second insulating layer; and
wherein axes of the first and second windings are aligned with a position of the first magnetic region.

22. The communication structure of claim 21, wherein circuits on the first and second semiconductor substrates communicate with each other through wireless transmission of signals using the first and second windings.

23. The communication structure of claim 21, wherein wireless transmission of power is made between circuits on the first and second semiconductor substrates using the first and second windings.

24. The communication structure of claim 21, further comprising a second magnetic region disposed within the second semiconductor substrate, wherein the first and second magnetic regions are aligned with each other.

25. A system, comprising:
a first integrated circuit including:
a first semiconductor layer having top and bottom surfaces;
a first magnetic region disposed in the first semiconductor layer and having top and bottom surfaces, wherein the bottom surface of the first magnetic region is located within the semiconductor layer flush with the bottom surface of the first semiconductor layer;
a first insulating layer over the top surface of the first semiconductor layer; and
a first winding formed wholly within said first insulating layer above the top surface of the first semiconductor layer and aligned with the first magnetic region; and
a second integrated circuit including:
a second semiconductor layer having a top surface;
a second insulating layer over the top surface of the second semiconductor layer and attached to and below the first integrated circuit; and
a second winding formed wholly within said second insulating layer above the top surface of the second semiconductor layer and aligned with the first magnetic region.

26. The system of claim 25, wherein the second integrated circuit further comprises a second magnetic region disposed in the second semiconductor layer.

27. The system of claim 25, wherein the bottom surface of the first semiconductor layer faces an upper surface of the second insulating layer.

28. The system of claim 25, wherein the bottom surface of the first semiconductor layer faces the bottom surface of the second semiconductor layer.

* * * * *